United States Patent
Wolf

(10) Patent No.: US 11,201,045 B2
(45) Date of Patent: Dec. 14, 2021

(54) APPARATUS AND METHOD FOR IONIZING AN ANALYTE, AND APPARATUS AND METHOD FOR ANALYSING AN IONIZED ANALYTE

(71) Applicant: PLASMION GMBH, Ingolstadt (DE)

(72) Inventor: Jan-Christoph Wolf, Ingolstadt (DE)

(73) Assignee: PLASMION GMBH, Augsburg (DE)

( * ) Notice: Subject to any disclaimer, the term of this patent is extended or adjusted under 35 U.S.C. 154(b) by 65 days.

(21) Appl. No.: 16/622,819

(22) PCT Filed: Jun. 15, 2018

(86) PCT No.: PCT/IB2018/054429
§ 371 (c)(1),
(2) Date: Dec. 13, 2019

(87) PCT Pub. No.: WO2018/229724
PCT Pub. Date: Dec. 20, 2018

(65) Prior Publication Data
US 2021/0151309 A1    May 20, 2021

(30) Foreign Application Priority Data
Jun. 16, 2017   (DE) .................... 10 2017 113 309.7

(51) Int. Cl.
*H01J 49/10* (2006.01)
*H01J 37/32* (2006.01)
(Continued)

(52) U.S. Cl.
CPC ............ *H01J 49/105* (2013.01); *H01J 27/08* (2013.01); *H01J 37/32036* (2013.01);
(Continued)

(58) Field of Classification Search
CPC ................. H01J 49/105; H01J 49/0031; H01J 37/32348; H01J 2217/49257;
(Continued)

(56) References Cited

U.S. PATENT DOCUMENTS

| 4,501,965 A | 2/1985 | Douglas |
| 4,948,962 A | 8/1990 | Mitsui et al. |

(Continued)

FOREIGN PATENT DOCUMENTS

| CN | 103177928 | 6/2013 |
| CN | 104064429 | 9/2014 |

(Continued)

OTHER PUBLICATIONS

U. Kogelschatz et al., Dielectric-Barrier Discharges. Principle and Applications. Journal de Physique IV Colloque, 1997, 07 (C4), pp. C4-47-C4-66.

(Continued)

*Primary Examiner* — Kiet T Nguyen
(74) *Attorney, Agent, or Firm* — Greenberg Traurig LLP

(57) ABSTRACT

The present invention discloses an ionization apparatus 10 for ionizing an analyte S, comprising an inlet E, an outlet A, a first electrode 1, a second electrode 2 and a dielectric element 3. The first electrode 1, the second electrode 2 and the dielectric element 3 are arranged relative to one another such that, by applying an electric voltage between the first electrode 1 and the second electrode 2, a dielectric barrier discharge is establishable in a discharge area 5 in the ionization apparatus 10. The first and second electrodes 1, 2 are arranged such that they are displaceable or movable relative to each other.

20 Claims, 13 Drawing Sheets

(51) Int. Cl.
*H01J 49/00* (2006.01)
*H01J 27/08* (2006.01)

(52) U.S. Cl.
CPC .. *H01J 37/32064* (2013.01); *H01J 37/32082* (2013.01); *H01J 37/32348* (2013.01); *H01J 37/32623* (2013.01); *H01J 37/32752* (2013.01); *H01J 37/32935* (2013.01); *H01J 49/0031* (2013.01); *H01J 2217/49257* (2013.01)

(58) Field of Classification Search
CPC .......... H01J 37/32036; H01J 37/32064; H01J 37/32082; H01J 37/32623; H01J 37/32752; H01J 37/32935; H01J 27/08; H05H 1/2406; H05H 1/2443
USPC ....................................................... 250/288
See application file for complete search history.

(56) References Cited

U.S. PATENT DOCUMENTS

| | | | |
|---|---|---|---|
| 5,252,827 | A | 10/1993 | Koga et al. |
| 5,961,772 | A | 10/1999 | Selwyn |
| 6,320,388 | B1 | 11/2001 | Sun et al. |
| 6,407,382 | B1 | 6/2002 | Spangler |
| 6,410,914 | B1 | 6/2002 | Park et al. |
| 6,646,256 | B2 | 11/2003 | Gourley et al. |
| 7,005,635 | B2 | 2/2006 | Ahern et al. |
| 7,095,019 | B1 | 8/2006 | Sheehan et al. |
| 7,119,330 | B2 | 10/2006 | Kalinitchenko |
| 7,256,396 | B2 | 8/2007 | Reilly |
| 7,910,896 | B2 | 3/2011 | Marta et al. |
| 8,247,784 | B2 | 8/2012 | Neidholdt et al. |
| 8,368,013 | B2 | 2/2013 | Ishimaru et al. |
| 8,772,710 | B2 | 7/2014 | Ouyang et al. |
| 8,803,084 | B2 | 8/2014 | Nishimura et al. |
| 2003/0070913 | A1 | 4/2003 | Miller et al. |
| 2007/0007448 | A1 | 1/2007 | Wang |
| 2007/0114389 | A1 | 5/2007 | Karpetsky et al. |
| 2008/0048107 | A1 | 2/2008 | Mcewen |
| 2010/0032559 | A1 | 2/2010 | Lopez-Avila et al. |
| 2010/0301199 | A1 | 12/2010 | Chen et al. |
| 2011/0108726 | A1 | 5/2011 | Hiraoka et al. |
| 2011/0168881 | A1 | 7/2011 | Sturgeon et al. |
| 2011/0253889 | A1 | 10/2011 | Ishimaru et al. |
| 2011/0316552 | A1* | 12/2011 | Shinada ................. G01N 27/70 324/464 |
| 2012/0160997 | A1* | 6/2012 | Fink ........................ H01J 49/10 250/282 |
| 2012/0292501 | A1 | 11/2012 | Sugiyama et al. |
| 2012/0292526 | A1 | 11/2012 | Hiraoka et al. |
| 2013/0161507 | A1 | 6/2013 | Nishimura et al. |
| 2014/0011282 | A1 | 1/2014 | Ouyang et al. |
| 2014/0331861 | A1 | 11/2014 | Makarov et al. |
| 2015/0069254 | A1 | 3/2015 | Fernandez et al. |
| 2016/0161379 | A1* | 6/2016 | Hendrikse ................ G01N 1/02 436/124 |

FOREIGN PATENT DOCUMENTS

| | | |
|---|---|---|
| DE | 102015122155 | 6/2017 |
| EP | 2450942 | 5/2012 |
| WO | 2009102766 | 8/2009 |
| WO | 2011091842 | 8/2011 |
| WO | 2015077879 | 6/2015 |
| WO | 2017103819 | 6/2017 |

OTHER PUBLICATIONS

S. Liu et al., Excitation of dielectric barrier discharges by unipolar submicrosecond square pulses, J. Phys. D: Appl. Phys. 34 (2001) 1632-1638.

Lee Chuin Chen et al., Development of ambient sampling chemi/chemical ion source with dielectric barrier discharge, J. Mass Spectrom. 2010, 45, 861-869.

M. M. Nudnova et al., Active capillary plasma souice for ambient mass spectrometry; Rapid Commun. Mass Spectrom. 26 (2012) 1447-1452.

Z. Wu et al., An Atmospheric Press Dielectric-barrier Discharge and ist Application for Detection of Environmental Pollutants, Advances in Biomedical Engineering 6 (2012) 133-139.

M. Sugiyama et al., Sensitive low-pressure dielectric barrier discharge ion source; Rapid Commun. Mass Spectrom. 27 (2013) 1005-1010.

L. Bregy et al., Real-time breath analysis with active capillary plasma inonization-ambient mass spectrometry, J. Breath Res. 8 (2014) 1-8.

J.-C. Wolf et al., Direct gas-phase detection of nerve and blister warfare agents utilizing active capillary plasma ionization mass spectrometry, Eur. J. Mass Spectrom. 21 (2015) 1-8.

J.-C. Wolf et al., Direct Quantification of Chemical Warfare Agents and Related Compounds at Low ppt Levels: Comparing Active Capillary Dielectric Barrier Discharge Plasma Ionization and Secondary Electrospray Ionization Mass Spectrometry, Anal. Chem. 87 (2015) 723-729.

J.-C. Wolf et al., A Radical-Mediated Pathway for the Formation of [M + H]+ in Dielectric Barrier Discharge Ionization; J. Am. Soc. Mass Spectrom. (2016) 27: 1468-1475.

J.-C. Wolf et al., Direct and Sensitive Detection of CWA Simulants by Active Capillary Plasma Ionization Coupled to a Handheld Ion Trap Mass Spectrometer; J. Am. Soc. Mass Spectrom. (2016) 27:1197-1202.

M. F. Mirabelli et al., Pesticide analysis at ppt concentalion levels: coupling nano-liquid chromatography with dielectric barrier discharge ionization-mass spectrometry; Anal Bioanal Chem (2016) 408: 3425-3434.

M. F. Mirabelli et al., Direct Coupling of Solid-Phase Microextraction with Mass Spectrometry: Sub-pg/g Sensitivity Achieved Using a Dielectric Barrier Discharge Ionization Souice; Anal. Chem. 2016, 88, 7252-7258.

M. F. Mirabelli et al., Atmospheric pressure soft ionization for gas chromatography with dielectric barrier discharge ionization-mass spectrometry (GC-DBDI-MS), The Royal Society of Chemistry 2017.

PCT International Search Report, International Application PCT/IB2018/054429, dated Oct. 8, 2018, pp. 1-2.

* cited by examiner

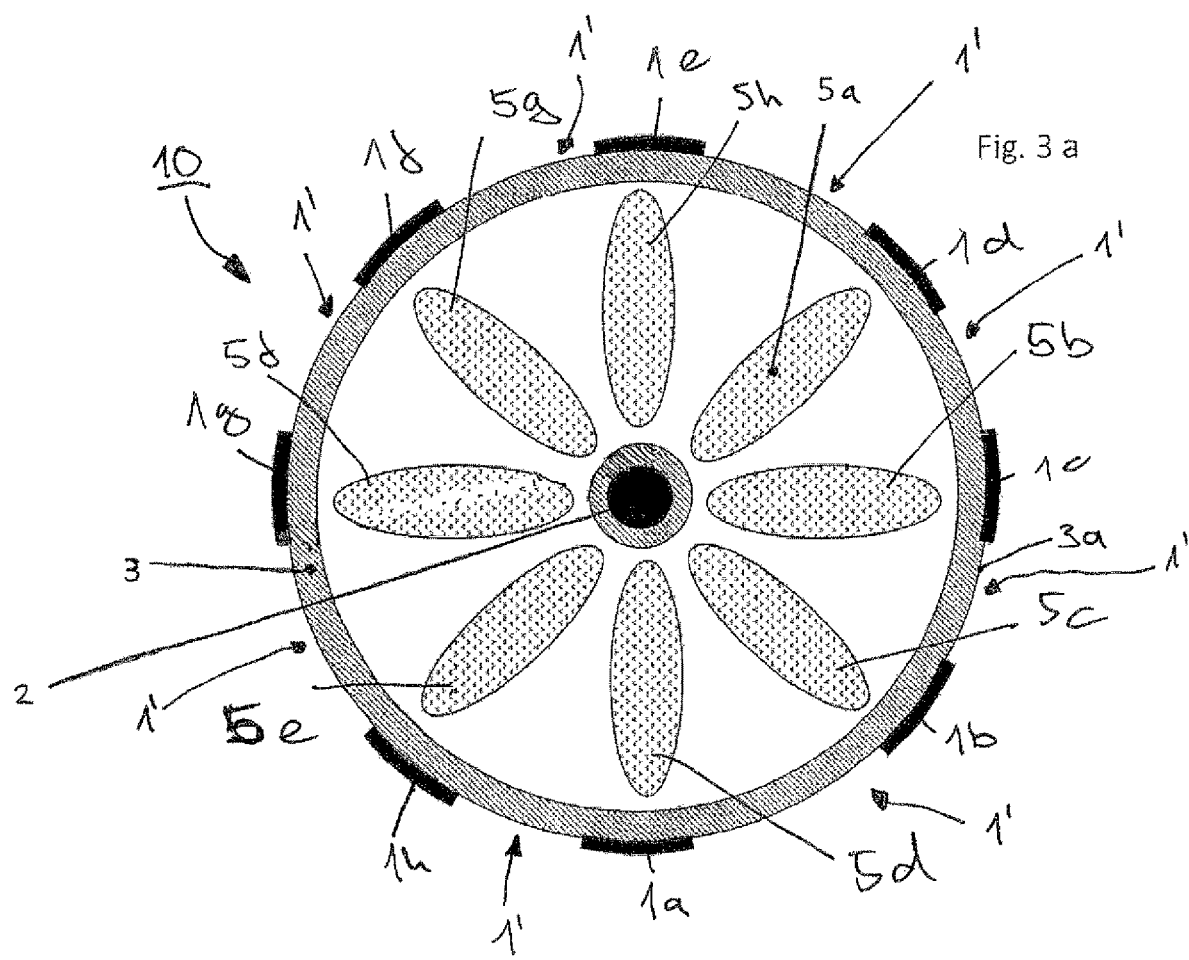

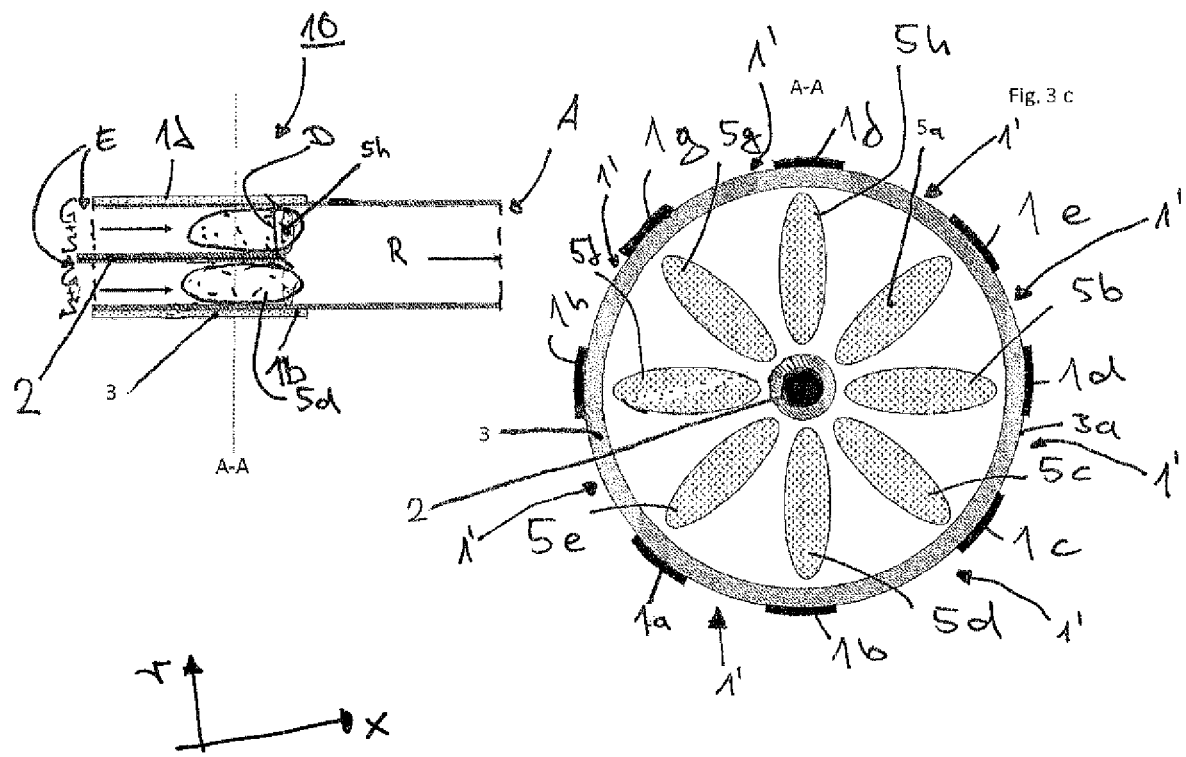

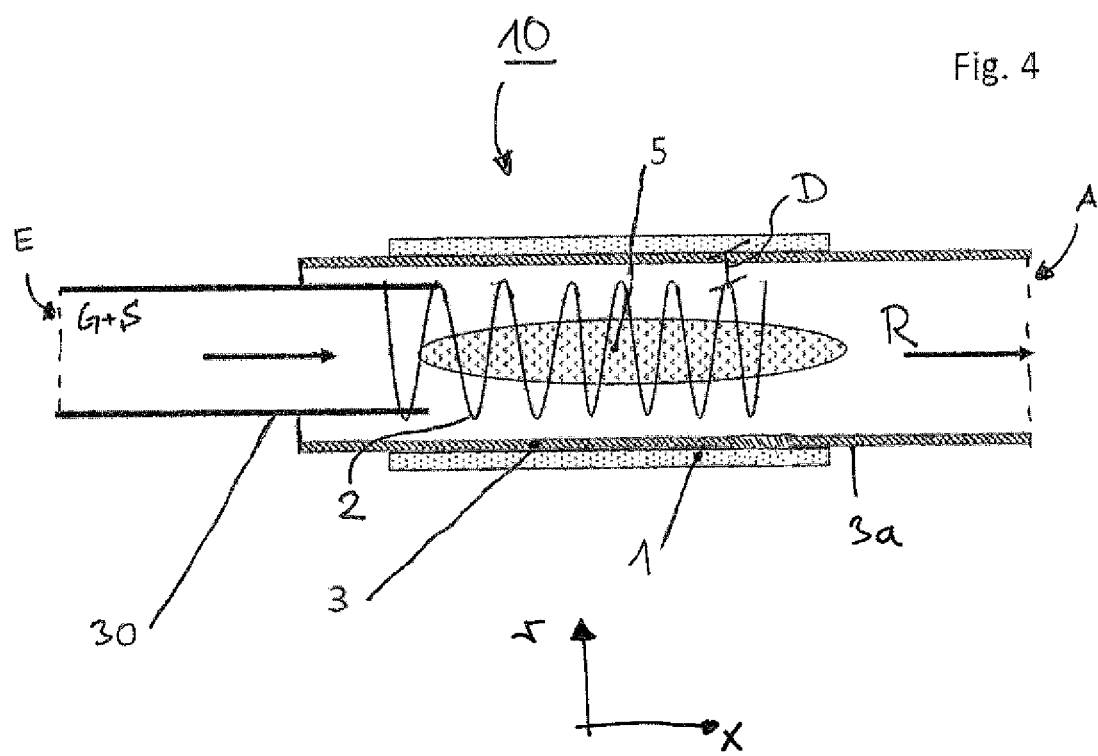

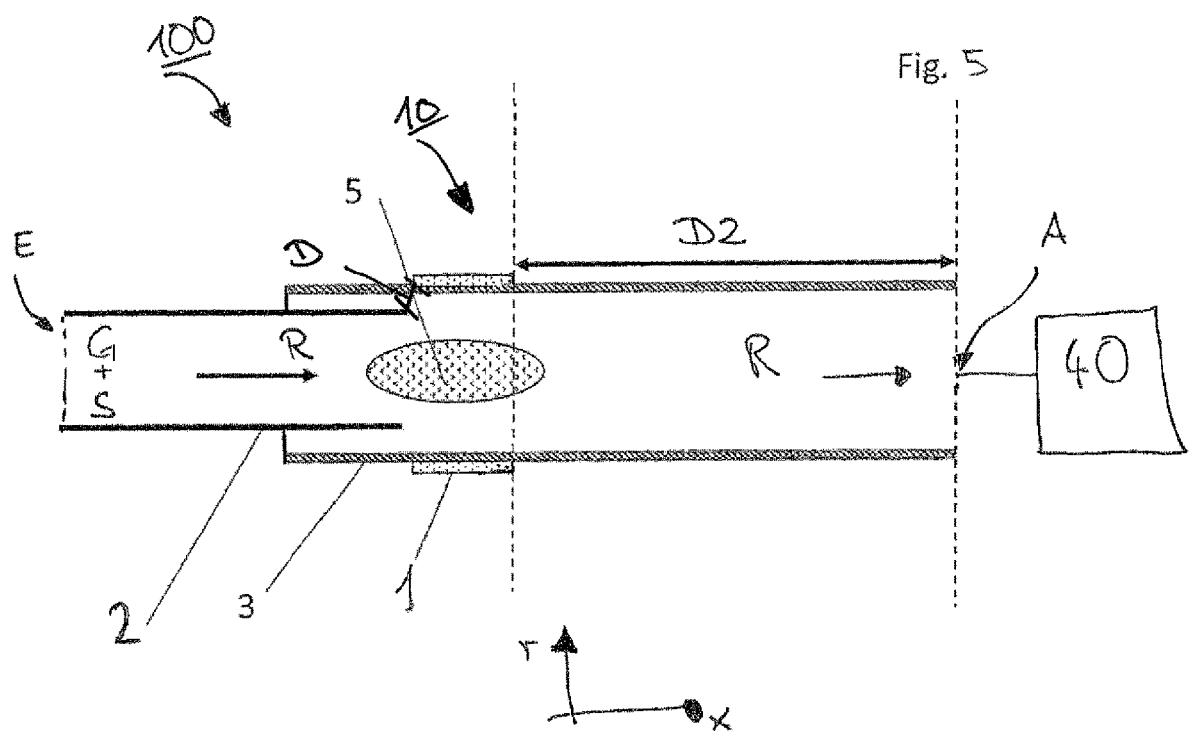

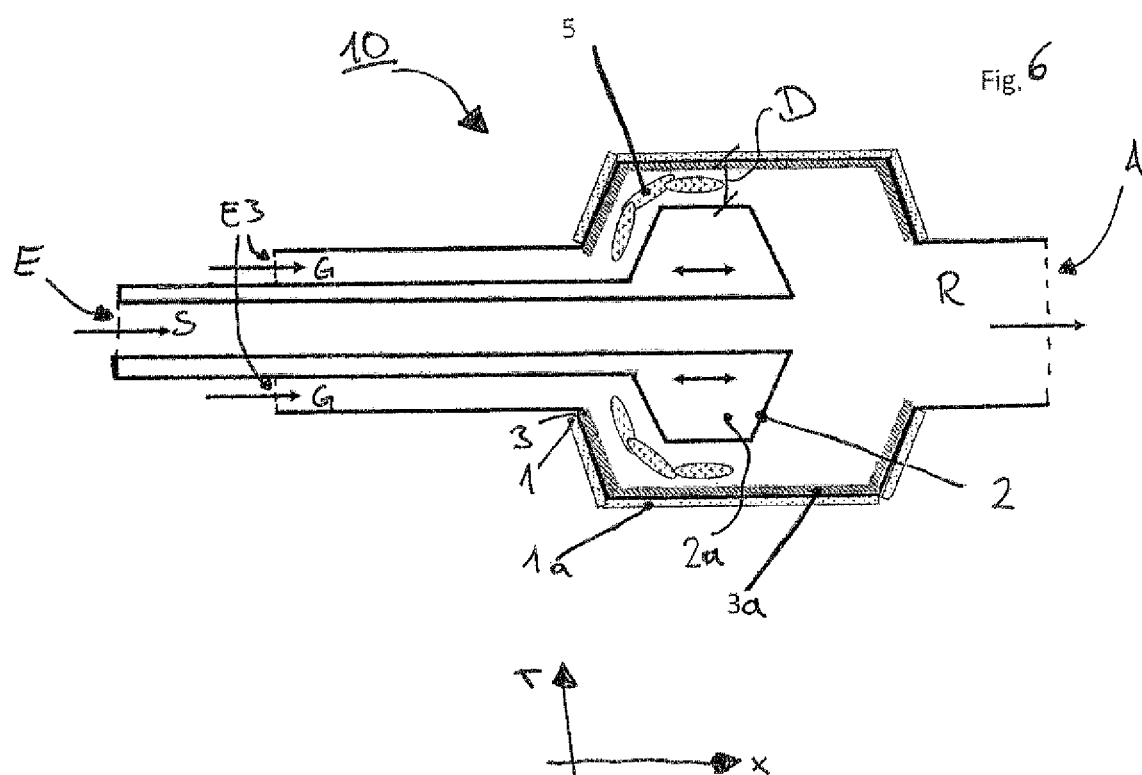

APPARATUS AND METHOD FOR IONIZING AN ANALYTE, AND APPARATUS AND METHOD FOR ANALYSING AN IONIZED ANALYTE

The present invention relates to the technical field of ionizing an analyte, in particular the ionizing or ionization of a substance in a carrier gas in preparation for its analysis.

Various ionization apparatuses based on a dielectric barrier discharge, which are used in various processes for ionization, are known from the prior art. After the ionization of an analyte, the latter can be analyzed.

US 2012 02 92 526 A1 discloses an ionization apparatus in which a sampling nozzle, an ion supply tube leading to an analysis apparatus and a dielectric barrier discharge tube are connected to a T-shaped tube.

However, the apparatuses and methods known from the prior art often have a comparatively low sensitivity, they fragment the analyte (thus making spectra established by subsequent analysis difficult to interpret) and they require a high constructional outlay.

It is the object of the present invention to provide an apparatus by means of which a discharge gas and an analyte are ionizable in a flow-through process and which, mainly, does not fragment the analyte, or fragments it only to a minor extent, which can be used under ambient conditions so as to avoid a high constructional outlay and high costs of equipment and which guarantees high sensitivity in a possible analysis of an ionized substance.

This object is achieved by an ionization apparatus according to claims 1, 14, 26, 38, 81 and by a method according to claims 8, 19, 31, 48, 89 as well as by an analyzer according to claims 54, 71 and by a method according to claims 65, 76.

The present invention is able to accomplish a flow-through ionization of an analyte, in particular for the purpose of analysis. In this respect, a so-called "soft" ionization can be applied, which, for the most part, does not destroy or fragment molecules, but leads to quasi-molecular ions through protonation reactions and charge-transfer reactions. Especially in combination with (high-resolution) mass spectrometry, the substance can thus be identified directly via its elemental composition. Due to the way in which the ionization apparatuses and ionization methods according to the present invention as well as the analyzer and the analysis method according to the present invention are configured, a very high sensitivity in the low femtogram to attogram range can be accomplished in a subsequent analysis.

The invention provides highly efficient ionization apparatuses (and a method associated therewith) as well as an analyzer (and a method associated therewith), which, in combination with mass spectrometry or ion mobility spectrometry, provide a highly sensitive "electronic nose" (in an analysis method) allowing a direct chemical analysis of molecules in the gaseous phase.

Application possibilities are, in addition to classical combinations with chromatographic methods (GC, HPLC, Nano-LC), also direct screening analyses, e.g. a direct pesticide analysis on fruit or vegetable surfaces.

For military or civil defense purposes, the technology may be used to detect toxic compounds or warfare agents. Especially in the case of chemical warfare agents, a very high sensitivity is required, since even the smallest concentrations of these agents may lead to poisoning that is dangerous to life.

Another related field of application is forensics or security checks (narcotic or explosive wipe tests).

Also a combination with sample preconcentration systems, such as SPME, is possible. The method can be used for medical "point of care" diagnostics (e.g. biomarker analysis in breath or in combination with SPME for hazardous and prohibited substances in blood, urine etc.).

The possibility of flow-through ionization simplifies sampling during analysis in general ("sucking in" analogously to the human nose), and this is important for rapid analysis applications or screening analyses, e.g. in industrial process control.

Furthermore, the hitherto existing problem of an effective transfer of charged particles at atmospheric pressure into a vacuum (analysis) is solved. Due to the mutual repulsion of the charged particles, large parts of the ions formed are lost without being used in currently employed processes for atmospheric pressure ionization (e.g. ESI, HESI, APCI, DART, DESI, LTP). The formation of ions directly in or at the inlet guarantees an effective transfer of the charged particles for analysis and thus a high sensitivity.

Chemical analyses usually have to be carried out not only qualitatively but also quantitatively. Due to the problem of an "open" connection between the ionization and the analyzer, as with existing methods, the quantification may easily be interfered with by external influences (drafts, diffusion of impurities, etc.). This entails the problem of wrong or incorrect analysis results. Through a flow-through ionization, the connection between ionization and analyzer is closed and the above-described problem arising with respect to quantification is solved in this way.

Existing plasma-based ionization processes or ionizing processes at quasi atmospheric pressure do not allow the analyte to be introduced into the discharge gas, since the analyte is destroyed in the discharge. This problem is solved by the formation of an extremely "soft" plasma with little fragmentation or no fragmentation at all.

Just like the efficiency, the degree of fragmentation occurring depends partly on the composition of the surrounding atmosphere (humidity, etc.). Thus, a suitable selection of additive compounds (dopants) or gas compositions will allow to reduce or increase the ionization efficiency and/or fragmentation. The latter is particularly useful for portable applications, since portable systems themselves are usually not able to generate characteristic fragments that are used to identify the substances.

Furthermore, the invention allows a miniaturization of analyzers and can be combined with portable systems, whereby the sensitivity of the latter will be increased substantially. In addition, operation with batteries or rechargeable batteries is possible. Normally, no operating materials (except electrical energy) are required and analyses can be carried out in less than 100 ms. Furthermore, due to the miniaturizability and the structural design of the present invention, the invention can be combined with other, already existing ionization methods (e.g. ESI, APCI, etc.), thus allowing simultaneous detection of different analytes, such as the parallel ionization of very polar and non-polar substances.

A further development of the ionization apparatus comprises the introduction of so-called "dopant" substances (e.g. in chemical ionization) upstream or downstream of the ionization apparatus, for the purpose of increasing the selectivity or the sensitivity.

An ionization apparatus for ionizing an analyte comprises an inlet, an outlet, a first electrode, a second electrode, a dielectric element and a charge carrier filter. The first electrode, the second electrode and the dielectric element are here arranged such that, by applying an electric voltage, a dielectric barrier discharge is establishable between the first electrode and the second electrode in a discharge area in the ionization apparatus. The analyte can flow into the ionization apparatus via the inlet. The analyte can flow through the discharge area and flow out of the ionization apparatus via the outlet. The charge carrier filter is arranged upstream of the outlet of the ionization apparatus. The charge carrier filter is configured such that ions or charged particles are filtered or selected on the basis of their type of charge.

Through the systematic selection (filtering) of reactive species, a defined ionization, which is easier to interpret or calculate, can be achieved in this way. In addition, this ionization by means of selected reactant ions allows a quantification of the analyte species on the basis of specific reaction coefficients even without intrinsic calibration. Moreover, undesired ionization side reactions with highly reactive or oxidizing species can be avoided, which, in turn, leads to easier interpretable and more meaningful measurement results in an optional subsequent analysis.

The charge carrier filter is preferably arranged after (downstream of) the discharge area.

The charge carrier filter may be configured such that a magnetic field can be generated. Due to the magnetic field, ions or charged particles can be filtered or selected on the basis of their type of charge. The charge carrier filter may also be a grid, especially a grid with an electric potential or a grid to which an electric potential is applied. Also the grid allows ions or charged particles to be filtered or selected on the basis of their type of charge.

The ionization apparatus may comprise a first section and a second section. The first section may here comprise the inlet as a first inlet, the first inlet allowing a flow of discharge gas therethrough. The second section may comprise a second inlet allowing a flow of analyte therethrough. The first section may be connected to the second section such that a flow therethrough can take place. The discharge area may be located in the first section of the ionization apparatus.

With such a structural design, the analyte does not flow directly through the discharge area, but the discharge gas flows through the discharge area, where it is ionized and, when the ionized discharge gas is brought into contact with the non-ionized analyte within the ionization apparatus, at least part of the charges of the ionized discharge gas will be transferred to the analyte, so that the latter will be ionized. This leads to a particularly soft ionization for the analyte, and only very little fragmentation of the analyte is to be expected.

Between the first electrode and the second electrode of the ionization apparatus, the distance may be less than 20 mm, preferably less than 10 mm, particularly preferred less than 5 mm and most preferred less than 2 mm.

In particular, the distance describes the smallest distance between the first electrode and the second electrode, i.e. the distance between a point of the first electrode and a point of the second electrode with the smallest length value.

The first electrode may be in contact with the outer surface of the dielectric element. In particular, the first electrode may be configured as a layer at or on the outer surface of the dielectric element.

By applying the electrode as a layer, parasitic discharges of the electrode can be avoided, which may also occur when the distance (e.g. gas inclusions) between the first electrode and the dielectric element is (very) small. The first electrode may be applied as a layer through a drying or curing liquid or suspension, e.g. through a metal paint. Likewise the layer may be applied on the outer surface of the dielectric element through transition from a vapor phase to a solid phase. This can be accomplished e.g. by sputtering, CVD or PVD, or other coating techniques.

One of the ionization apparatuses can be operated by a method. According to this method, the analyte is introduced into the ionization apparatus, the analyte is ionized in the ionization apparatus, in particular by a dielectric barrier discharge in the discharge area, and the ionized analyte is discharged from the ionization apparatus via the outlet.

Via the inlet as a first inlet, a discharge gas can be introduced into the ionization apparatus and ionized in the discharge area. Via an inlet or the second inlet, the analyte can be introduced into the ionization apparatus and the analyte can be brought into contact with the ionized discharge gas in the ionization apparatus, so that an ionization of the analyte will be carried out in the ionization apparatus.

The pressure in the ionization apparatus may be higher than 40 kPa, preferably higher than 60 kPa and particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, preferably not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and the second electrodes may be supplied with a sinusoidal voltage. The sinusoidal voltage of one of the electrodes may here be shifted by half a period duration with respect to the other one of the two electrodes.

A further ionization apparatus for ionizing an analyte comprises an inlet, an outlet, a first electrode, a second electrode and a dielectric element. The first electrode, the second electrode and the dielectric element are here arranged such that a dielectric barrier discharge can be established in a discharge area in the ionization apparatus by an electric voltage applied between the first electrode and the second electrode. The dielectric element has an outer surface, the first and the second electrode being arranged on the outer surface of the dielectric element.

This allows in particular a miniaturization of the ionization source, while optimizing at the same time the flow profile, and this will be of advantage for the subsequent analysis carried out e.g. with portable devices. In addition, undesirable fragmentation reactions, which may be caused by the electric discharge during plasma formation, can effectively be suppressed by separating the plasma gas flow from the analyte gas flow.

The ionization apparatus may comprise a capillary with an inlet. The capillary may be arranged, at least sectionwise, inside the dielectric element.

The inlet may allow a flow of analyte into the capillary and the inlet of the ionization apparatus may allow a flow of discharge gas therethrough. In the ionization apparatus, the flows of the discharge gas and of the analyte may be unitable.

The distance between the first electrode and the second electrode may be less than 20 mm, preferably less than 10 mm, particularly preferred less than 5 mm and most preferred less than 2 mm.

In particular, the distance is the smallest distance between the first electrode and the second electrode, the smallest distance being determined as the length between a point of the first electrode and a point of the second electrode with the smallest value.

One of the first and second electrodes or both the first electrode and the second electrode may be in contact with the outer surface of the dielectric element. Preferably, the first electrode and/or the second electrode is/are configured as a layer, the layer being applied through a drying or curing liquid or suspension or through transition from a vapor phase to a solid phase. This has the above described advantage that parasitic discharges will be avoided.

One of the ionization apparatuses can be operated by a method. The method comprises the introduction of an analyte into the ionization apparatus, the ionizing of the analyte in the ionization apparatus, preferably by a dielectric barrier discharge in the discharge area, and the discharge of the ionized analyte from the ionization apparatus via the outlet.

A discharge gas can be introduced into the ionization apparatus via the inlet, the discharge gas can be ionized in the discharge area and the analyte can be introduced via an inlet of a capillary or the inlet of the capillary. The analyte can be brought into contact with the ionized discharge gas in the ionization apparatus, whereby an ionization of the analyte is carried out.

The pressure in the ionization apparatus may be higher than 40 kPa, preferably higher than 60 kPa and particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, particularly preferred not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and the second electrodes may be supplied with a sinusoidal voltage. The sinusoidal voltage of one of the electrodes may here be shifted by half a period duration with respect to the other one of the two electrodes.

A further ionization apparatus for ionizing an analyte comprises an inlet, an outlet, a first electrode, a second electrode and a dielectric element. The first electrode, the second electrode and the dielectric element are arranged such that a dielectric barrier discharge can be established in a discharge area in the ionization apparatus by an electric voltage applied between the first electrode and the second electrode. At least one of the first and second electrodes is not fully circumferential or is circumferentially interrupted.

In particular, at least one of the first and second electrodes is arranged on an outer surface of the dielectric element, which preferably allows a flow therethrough, and is not fully circumferential or is circumferentially interrupted. Circumferentially may here be understood as a circumferential direction in a cylindrical coordinate system. The axial direction of the cylindrical coordinate system may here be understood to be parallel to the axis of the dielectric element and/or parallel to the (intended) flow direction in the ionization apparatus.

In particular, at least one of the first and second electrodes is not fully circumferential or is circumferentially interrupted in a plane perpendicular to a flow direction through the ionization apparatus.

This means that, in the case of a complete circulation of the circumference (circumferential direction in cylindrical coordinates) of the first and second electrodes, at least one interruption may be formed, in particular in the plane perpendicular to the flow direction.

The structural design according to the present invention leads to one or a plurality of strongly localized plasma discharges (discharge areas). This has the effect that not the entire analyte flow passes through the plasma discharge (discharge area), but also through areas in which no plasma discharge (no discharge area) takes place. The undesirable fragmentation of the analyte through direct interaction with the discharge can here be reduced. In addition, the length of the discharge path as extension of the discharge areas can be adapted to the required application (from localized discharge points up to a discharge path having a length of several centimeters in the axial direction), whereby the number and the density of the reactive species and thus the fragmentation as well as the sensitivity can be adapted to the respective analytical application and optimized.

The first electrode may be located on the outer surface of the dielectric element.

The first electrode may, at least sectionwise, be spiral or helical in shape. Preferably, the spiral or helical section comprises at least one complete (360 degrees) winding, preferably the section comprises at least five complete windings.

The first electrode may comprise at least two subelectrodes, the at least two subelectrodes being spaced apart circumferentially, in particular in the plane perpendicular to the flow direction. Each of the subelectrodes may be connected to a control device via a respective line.

Preferably, the first electrode comprises four subelectrodes.

The subelectrodes may be arranged in a uniform manner in the circumferential direction, so that, in the circumferential direction, the subelectrodes are spaced apart by the same distance or the interruption between two respective subelectrodes is identical.

The subelectrodes may be circular in shape or rod-shaped.

The second electrode may be arranged, at least sectionwise, in the dielectric element. Preferably, the first electrode may be arranged outside the dielectric element.

The first electrode, the second electrode and the dielectric element may be arranged relative to one another such that, by applying an electric voltage between the first electrode and the second electrode, a dielectric barrier discharge is establishable in at least two discharge areas in the ionization apparatus, the two discharge areas being spaced apart axially in the flow direction and/or circumferentially, in particular in a plane perpendicular to the flow direction.

Between the first electrode and the second electrode of the ionization apparatus, the distance may be less than 20 mm, preferably less than 10 mm, particularly preferred less than 5 mm and most preferred less than 2 mm.

In particular, the distance describes the smallest distance between the first electrode and the second electrode, i.e. the distance between a point of the first electrode and a point of the second electrode with the smallest length value.

The first electrode may be in contact with the outer surface of the dielectric element. In particular, the first electrode may be configured as a layer at or on the outer surface of the dielectric element. By applying the electrode as a layer, parasitic discharges of the electrode can be avoided, which may also occur when the distance (e.g. gas inclusions) between the first electrode and the dielectric element is (very) small. The first electrode may be applied as a layer through a drying or curing liquid or suspension, e.g. through a metal paint. Likewise the layer may be applied through transition from a vapor phase to a solid phase on the outer surface of the dielectric element. This can be accomplished e.g. by sputtering, CVD or PVD, or other coating techniques.

One of the ionization apparatuses may be operated by a method. The method comprises the steps of introducing an analyte into the ionization apparatus, ionizing the analyte in the ionization apparatus, and discharging the ionized analyte from the ionization apparatus via the outlet. Preferably, the analyte is ionized through a dielectric barrier discharge in the discharge area or the discharge areas.

The pressure in the ionization apparatus may be higher than 40 kPa, preferably higher than 60 kPa, particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, preferably not more than 500 ns and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and second electrodes may be supplied with a sinusoidal voltage. The sinusoidal voltage of one of the electrodes may be shifted by half a period duration with respect to the other one of the two electrodes.

A further ionization apparatus for ionizing an analyte comprises an inlet, an outlet, a first electrode, a second electrode and a dielectric element. The first electrode, the second electrode and the dielectric element are arranged relative to one another such that, by applying an electric voltage between the first electrode and the second electrode, a dielectric barrier discharge is establishable in a discharge area in the ionization apparatus. The first and second electrodes are arranged such that they are displaceable relative to each other.

Due to the displaceability of the electrodes, the extension of the plasma (the extension of the discharge area) and thus the number of reactive species and the reaction space, respectively, can be adapted to the respective analysis, in particular to the respective analyte, thus allowing the ionization efficiency or fragmentation to be adjusted, whereby the ion source can be adapted to the respective subsequent optional analysis task (e.g. high or low sensitivity).

The electrodes may be arranged to be displaceable relative to each other in a controllable manner, in particular the electrodes may be displaceable relative to each other by a controllable electric motor.

The first electrode and the second electrode may, at least sectionwise, be spiral or helical in shape.

The second electrode may, at least sectionwise, be arranged in the dielectric element. Preferably, the first electrode is arranged outside the dielectric element.

The displaceability of the first and second electrodes relative to each other is given preferably in the flow direction or in a direction opposite to the flow direction through the ionization apparatus.

At least one of the first and/or second electrodes may comprise at least one winding.

Between the first electrode and the second electrode of the ionization apparatus, the distance may be less than 20 mm, preferably less than 10 mm, particularly preferred less than 5 mm and most preferred less than 2 mm. In particular, the distance describes the smallest distance between the first electrode and the second electrode, i.e. the distance between a point of the first electrode and a point of the second electrode with the smallest length value.

Preferably, the first electrode is arranged to be displaceable relative to the dielectric element. The second electrode may be arranged to be non-displaceable relative to the dielectric element.

One of the ionization apparatuses may be operated by a method. According to this method, the analyte is introduced into the ionization apparatus, the analyte is ionized in the ionization apparatus, preferably through a dielectric barrier discharge in the discharge area, and the ionized analyte is discharged from the ionization apparatus via the outlet.

The pressure in the ionization apparatus may be higher than 40 kPa, preferably higher than 60 kPa and particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, particularly preferred not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and the second electrodes may be supplied with a sinusoidal voltage. The sinusoidal voltage of one of the electrodes may here be shifted by half a period duration with respect to the other one of the two electrodes.

An analyzer for analyzing an ionized analyte comprises an ionization apparatus and an analysis unit. The ionization apparatus comprises an inlet, an outlet, a first electrode, a second electrode and a dielectric element. The first electrode, the second electrode and the dielectric element are arranged relative to one another such that, by applying an electric voltage between the first electrode and the second electrode, a dielectric barrier discharge is establishable between the first electrode and the second electrode in a discharge area. The ionization apparatus is connected to the analysis unit. The connection is configured such that an analyte ionized in the ionization apparatus or (various) ionized analytes can flow out of the outlet of the ionization apparatus directly into the analysis unit. The outlet of the ionization apparatus and the first electrode or the discharge area are spaced apart in the flow direction (x-direction). The distance is less than 50 mm or the outlet of the ionization apparatus and the first electrode overlap in the flow direction (x-direction).

The connection between the ionization apparatus and the analysis unit is here configured such that, after a (first) ionization has taken place through a so-called reactive impact, a further reaction, caused e.g. by charge transfer reactions, of the analyte or the analytes with a reactive species, which has been formed in the plasma, will not be possible. Both the ionization and the consecutive reactions depend on the collision frequency of the molecules. This collision frequency may be influenced by temperature and pressure.

By means of the structural design according to the present invention, ionization with kinetic product control is accomplished. This means that the analysis of the ionized analyte(s) takes place so quickly that the thermodynamic equilibrium aimed at by nature is not achieved or that occurrence of the equilibrium, e.g. when the ionized analyte(s) is/are introduced into a vacuum, will be slowed down. As a result, suppression effects and competitive reactions, which normally occur in the case of atmospheric-pressure ionization methods, will be suppressed effectively. In this way, not only can more analytes be ionized than before, but they can reliably be quantified even in complex mixtures.

The ionized analyte may enter a vacuum chamber of the analysis unit. The pressure prevailing in this vacuum chamber may be lower than the ambient pressure, in particular lower than the pressure prevailing in the ionization apparatus.

Between the ionization apparatus and the vacuum chamber of the analysis unit, a pressure gradient may prevail. Preferably, the pressure gradient is at least 20 kPa, particularly preferred at least 50 kPa.

The distance between the outlet of the ionization apparatus and the first electrode may be adjustable.

The outlet of the ionization apparatus may be configured to be displaceable relative to the first electrode.

A reduction in size of the cross-section of the ionization apparatus or a restrictor may be arranged upstream of the outlet of the ionization apparatus in the flow direction (x-direction). Preferably, the first electrode is arranged on the reduced cross-section or the restrictor.

The first electrode may be arranged on an outer surface of the dielectric element or it may be in contact with the outer surface.

The second electrode may be arranged, at least sectionwise, in the dielectric element.

The distance between the first electrode and the second electrode of the ionization apparatus may be less than 20 mm, preferably less than 10 mm, particularly preferred less than 5 mm and most preferred less than 2 mm. This distance is in particular the smallest distance between the first electrode and the second electrode, i.e. it is the distance having the smallest length value between a point of the first electrode and a point of the second electrode.

The distance between the outlet of the ionization apparatus and the first electrode may be less than 40 mm, preferably less than 30 mm, particularly preferred less than 20 mm, even more preferred less than 10 mm, and most preferred less than 5 mm. This applies to the flow direction (x-direction).

The analysis unit may be a mass spectrometer or an ion mobility spectrometer.

The outlet of the ionization apparatus may have a smaller cross-sectional area than the inlet of the ionization apparatus.

One of the analyzers may be used for a method for analyzing an analyte. The method comprises the steps of introducing an analyte into the ionization apparatus, ionizing the analyte, preferably by a dielectric barrier discharge in the discharge area, discharging the ionized analyte from the ionization apparatus via the outlet into the analysis unit, and analyzing the analyte in the analysis unit.

The pressure in the ionization apparatus may be higher than 40 kPa, preferably higher than 60 kPa, particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, particularly preferred not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and second electrodes may be supplied with a sinusoidal voltage. The sinusoidal voltage of one of the electrodes may here be shifted by half a period duration with respect to the other one of the two electrodes.

A further analyzer for analyzing an ionized analyte may comprise an ionization apparatus and an analysis unit. The ionization apparatus comprises an inlet, an outlet, a first electrode, a second electrode and a dielectric element. The first electrode, the second electrode and the dielectric element are arranged relative to one another such that, by applying an electric voltage between the first electrode and the second electrode, a dielectric barrier discharge is establishable in a discharge area. The ionization apparatus is connected to the analysis unit such that an analyte or (various) analytes ionized in the ionization apparatus can flow out of the outlet of the ionization apparatus directly into the analysis unit. The ionization apparatus is configured and connected to the analysis unit such that the analyte can flow over a distance between the discharge area and the analysis unit in less than 1 s.

The distance between the discharge (the discharge area) and the analysis unit may here be dimensioned such that the ionization time or dwell time, which results from the flow-through volume at the beginning of the plasma discharge (discharge area) and the flow velocity, is less than 1 s, preferably less than 500 ms, particularly preferred less than 200 ms, even more preferred less than 50 ms, and most preferred less than 20 ms, prior to the analysis or the suppression of ionization (e.g. by introduction into a vacuum).

The flow-through volume comprises here the distance between the discharge area or the beginning of the plasma discharge and the analysis or the suppression of ionization (e.g. by means of a vacuum) and the cross-section through which the flow takes place. The cross-section through which the flow takes place need not be constant throughout the distance over which the flow takes place.

The distance of the bringing together of reactive species (e.g. in a discharge gas) and the analyte relative to the analysis unit may be dimensioned such that the ionization time (reaction time of the analyte with reactive species), which results from the flow-through volume beginning at the first contact time of the analyte molecules with the reactive species formed by the plasma discharge and the flow velocity, is less than 1 s, preferably less than 500 ms, particularly preferred less than 200 ms, even more preferred less than 50 ms, and most preferred less than 20 ms, prior to the analysis or the suppression of ionization (e.g. by introduction into a vacuum).

The reactive species and analyte can be brought together directly in the discharge or later on (downstream). An ionization of the analyte takes place during the first local contact of the analyte with the reactive species.

These usually metastable plasma species are normally detected by optical (spectroscopic) methods, since they exhibit characteristic emissions or absorption lines. This allows a discharge area or a discharge to be localized.

By means of the structural design according to the present invention, ionization with kinetic product control is again accomplished, and this will entail the above described effects and advantages.

The analysis unit may comprise a vacuum chamber and the ionization apparatus may be connected to the analysis unit such that the analyte can enter the vacuum chamber of the analysis unit directly. In particular, the ionization apparatus may be connected to the analysis unit such that the analyte can flow over the distance between the discharge area and the vacuum chamber in less than 1 s.

A flow over the distance between the discharge area and the analysis unit or the vacuum chamber of the analysis unit can take place in less than 500 ms, preferably in less than 200 ms, particularly preferred in less than 50 ms, most preferred in less than 20 ms.

In the case of a volume flow through the ionization apparatus of less than 20 L/min, preferably less than 10 L/min, particularly preferred less than 5 L/min, most preferred less than 2.5 L/min, the analyte (S) can flow over the distance between the discharge area and the analysis unit or the vacuum chamber of the analysis unit within a time lying below the respective upper time limit.

Between the ionization apparatus and the vacuum chamber of the analysis unit, a pressure gradient may prevail. Preferably, the pressure gradient is at least 20 kPa, particularly preferred at least 50 kPa.

The distance between the outlet of the ionization apparatus and the first electrode may be adjustable.

The outlet of the ionization apparatus may be configured to be displaceable relative to the first electrode.

A reduction in size of the cross-section of the ionization apparatus or a restrictor may be arranged upstream of the outlet of the ionization apparatus in the flow direction (x-direction). Preferably, the first electrode is arranged on the reduced cross-section or the restrictor.

The first electrode may be arranged on an outer surface of the dielectric element or it may be in contact with the outer surface.

The second electrode may, at least sectionwise, be arranged in the dielectric element.

The distance between the first electrode and the second electrode of the ionization apparatus may be less than 20 mm, preferably less than 10 mm, particularly preferred less than 5 mm and most preferred less than 2 mm. In particular, this distance is the smallest distance between the first electrode and the second electrode, i.e. it is the distance with the smallest length value between a point of the first electrode and a point of the second electrode.

The distance between the outlet of the ionization apparatus and the first electrode is less than 40 mm, preferably less than 30 mm, particularly preferred less than 20 mm, even more preferred less than 10 mm, and most preferred less than 5 mm. This applies to the flow direction (x-direction).

The analysis unit may be a mass spectrometer or an ion mobility spectrometer.

The outlet of the ionization apparatus may have a smaller cross-sectional area than the inlet of the ionization apparatus.

One of the analyzers may be used for a method for analyzing an analyte. The method comprises the steps of introducing an analyte into the ionization apparatus, ionizing the analyte, preferably by a dielectric barrier discharge in the discharge area, discharging the ionized analyte from the ionization apparatus via the outlet into the analysis unit, and analyzing the analyte in the analysis unit.

The pressure in the ionization apparatus may be higher than 40 kPa, preferably higher than 60 kPa, particularly preferred higher than 80 kPa. Most preferred, the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 µs, particularly preferred not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and second electrodes may be supplied with a sinusoidal voltage. The sinusoidal voltage of one of the electrodes may here be shifted by half a period duration with respect to the other one of the two electrodes.

A further ionization apparatus for ionizing an analyte comprises a first inlet, a second inlet, an outlet, a first electrode, a second electrode and a dielectric element. The first electrode, the second electrode and the dielectric element are here arranged relative to one another such that, by applying an electric voltage between the first electrode and the second electrode, a dielectric barrier discharge is establishable between the first electrode and the second electrode in a discharge area in the ionization apparatus. The first and second electrodes are arranged such that they are displaceable relative to each other.

By displacing the electrode, the plasma can be formed closer to or more remote from a point of coming together with the analyte. This allows different reactive components of the plasma to react with the analyte, since the plasma components have life states of different lengths. The ionization efficiency and the fragmentation can thus be controlled directly, since shorter-lived species are generally more reactive than long-lived species.

The second electrode may comprise a section that curves outwards in the r-direction.

The first electrode and/or the dielectric element may comprise a section that curves outwards in the r-direction. The section of the second electrode that curves outwards in the r-direction and the section of the first electrode and/or of the dielectric element that curves outwards in the r-direction may be configured in a corresponding manner. The respective curved section is here configured in a substantially uniform manner.

The section of the second electrode that curves outwards in the r-direction may be displaceable in the section of the first electrode and/or of the dielectric element that curves outwards in the r-direction.

The displaceability of the second electrode relative to the first electrode and/or the dielectric element may here be limited by the structural design of the curved section of the first electrode and/or the dielectric element.

The second electrode may, at least sectionwise, be arranged in the dielectric element. Preferably, the first electrode is arranged outside the dielectric element.

The displaceability of the first and second electrodes relative to each other may be given in the flow direction or in a direction opposite to the flow direction.

Between the first electrode and the second electrode of the ionization apparatus, the distance may be less than 20 mm, preferably less than 10 mm, particularly preferred less than 5 mm and most preferred less than 2 mm. Preferably, the distance describes the smallest distance between the first electrode and the second electrode, the distance between a point of the first electrode and a point of the second electrode exhibiting the smallest length value.

The first electrode may be arranged to be non-displaceable relative to the dielectric element. Preferably, the second electrode is arranged to be displaceable relative to the dielectric element.

One of the ionization apparatuses can be operated by a method. The method comprises introducing an analyte into the ionization apparatus, ionizing the analyte in the ionization apparatus, in particular by means of a dielectric barrier discharge in the discharge area, and discharging the ionized analyte from the ionization apparatus via the outlet.

The pressure in the ionization apparatus may be higher than 40 kPa, preferably higher than 60 kPa, particularly preferred higher than 80 kPa. Most preferred the pressure in the ionization apparatus is substantially the atmospheric pressure. The substantially atmospheric pressure may allow a variation relative to atmospheric pressure of 10% above the atmospheric pressure or 10% below the atmospheric pressure.

Between the first electrode and the second electrode, an electric voltage may be applied, so as to generate a dielectric barrier discharge. The voltage may be a voltage of not more than 20 kV, preferably not more than 10 kV, particularly preferred not more than 5 kV and most preferred between 1 kV and 3 kV.

The dielectric barrier discharge may be caused by unipolar high-voltage pulses. The pulse duration may here be not more than 1 μs, preferably not more than 500 ns, and most preferred between 100 ns and 350 ns.

The high-voltage pulses may have a frequency of not more than 100 GHz, preferably not more than 100 MHz, particularly preferred not more than 500 kHz and most preferred between 1 kHz and 100 kHz.

The first and the second electrodes may be supplied with a sinusoidal voltage. The sinusoidal voltage of one of the electrodes may here be shifted by half a period duration with respect to the other one of the two electrodes.

In general, the first and/or second electrode of the various embodiments of the ionization apparatuses disclosed may consist of a material conductive to electric current, such as metal. In particular, the first and/or second electrode may comprise gold, silver or a metallic alloy (also in the form of a layer).

The first and/or second electrode of the various embodiments of the disclosed ionization apparatuses may be configured as a hollow body (allowing a flow therethrough), e.g. as a ring or as a hollow cylinder, optionally with an interruption in the circumferential direction.

In the various embodiments of the disclosed ionization apparatuses, the first electrode may be arranged, at least sectionwise, outside the dielectric element and the second electrode may be arranged, at least sectionwise, within the dielectric element.

In the various embodiments of the disclosed ionization apparatuses, the second electrode may be configured as a wire, which is arranged concentrically or eccentrically, at least sectionwise, in the dielectric element.

The dielectric element of the various embodiments of the disclosed ionization apparatuses may consist of a solid material and may in particular consist of, or comprise, a plastic material (e.g. PMMA or PP). In particular, the dielectric element consists of quartz glass or comprises quartz glass. Also various ceramics or ceramic composite materials, such as corundum, are suitable materials.

In the various embodiments of the disclosed ionization apparatuses, the inlet of the ionization apparatus may be open to the surroundings, and the discharge gas is the atmosphere, in particular air, surrounding the inlet. Also other discharge gases may be used, the discharge gas may, for example, contain nitrogen, oxygen, methane, carbon dioxide, carbon monoxide or at least one noble gas, or mixtures thereof. In the discharge area, a dopant may be present in addition to the discharge gas. Like the discharge gas, the dopant, e.g. methane, ethane, hydrogen, chlorobenzene or mixtures thereof or mixtures of various components, may be introduced via the inlet of the ionization apparatus or via a further inlet into the ionization apparatus.

The dielectric barrier discharge within the various embodiments of the ionization apparatus may also be established by applying a square-wave or sawtooth voltage or by other forms of alternating voltages known per se and having frequencies of 100 GHz or less.

The dielectric barrier discharge within the various embodiments of the ionization apparatus may also be established by applying a direct voltage.

Generally, the various embodiments of the disclosed ionization apparatuses may comprise an ion mass filter. Through an ion mass filter, a specific ion or specific ions are isolated or selected on the basis of their mass or their mass-to-charge ratio. An example of an ion mass filter is a quadrupole. An ion mass filter may be arranged between the discharge area of an ionization apparatus and the inlet of the ionization apparatus.

By arranging an analysis unit on one of the various embodiments of the disclosed ionization apparatuses, an analyzer can be formed. Preferably, the ionization apparatus is directly connected to the analysis unit (if necessary, via a short intermediate element). The analysis unit arranged is preferably a unit, which is able to execute an analysis on the basis of a molecular charge, e.g. a mass spectrometer, an ion mobility spectrometer or comparable devices.

Preferably, an analyzer may have arranged therein, in addition to an ionization apparatus, at least one further ionizing apparatus, e.g. an apparatus for executing electron impact ionization or electrospray ionization.

One of the disclosed ionization apparatuses may, in combination with an analysis unit as an analyzer, be configured as a handheld device (portable device).

One of the disclosed ionization apparatuses may be used for flow-through ionization.

The embodiments of the present invention are described on the basis of examples and are not shown in a manner in which limitations from the figures are transferred to or read into the claims.

FIG. 1 shows schematically an embodiment of an ionization apparatus 10 with a first section 10a and a second section 10b.

FIG. 1a shows schematically an embodiment of an ionization apparatus 10 with a first section 10a, a second section 10b and a grid 20 as a charge carrier filter.

FIG. 1b shows schematically an embodiment of an ionization apparatus 10 with a first section 10a, a second section 10b and a magnet 21 as a charge carrier filter.

FIG. 2 shows schematically an embodiment of an ionization apparatus 10 with first and second electrodes 1, 2 on an outer surface 3a of a dielectric element 3.

FIG. 3 shows schematically an embodiment of an ionization apparatus 10 with subelectrodes 1a, 1b, . . . of the first electrode 1.

FIG. 3c shows schematically an embodiment of an ionization apparatus 10 with subelectrodes 1a, 1b, . . . of the first electrode 1 and a sectional view of this embodiment.

FIG. 4 shows schematically an embodiment of an ionization apparatus 10 with first and second electrodes 1, 2 at a first position, the electrodes being displaceable relative to each other.

Figure 4A:
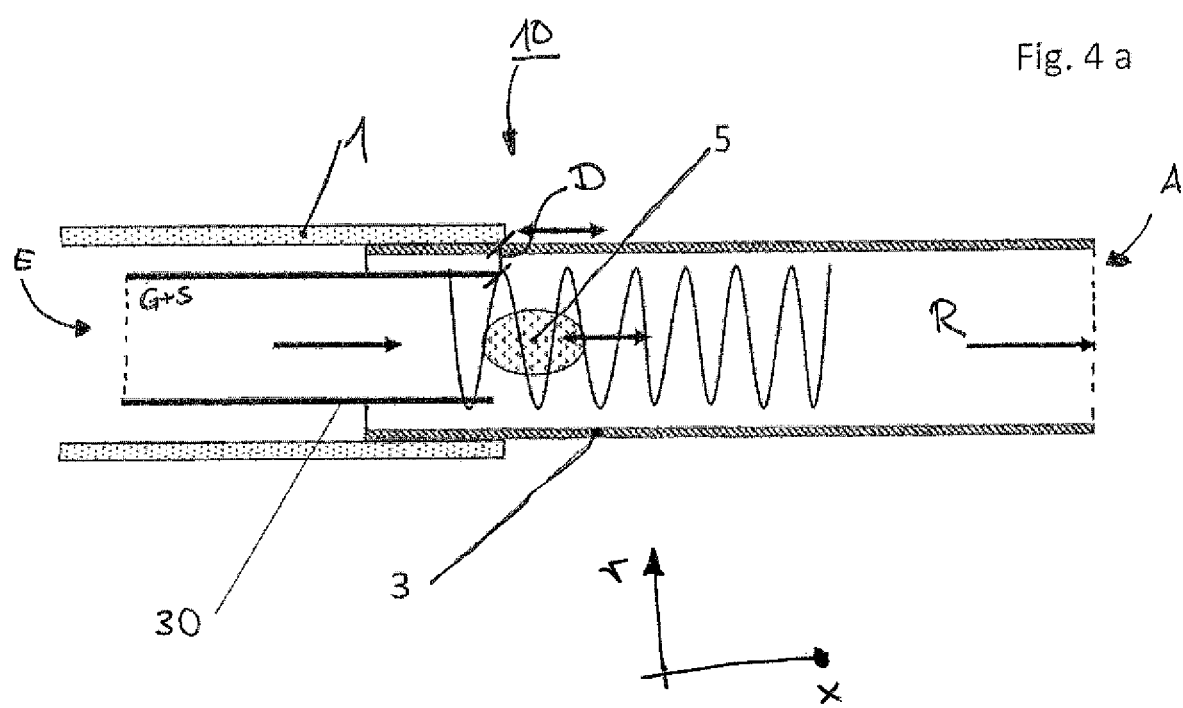

FIG. 4a shows schematically an embodiment of an ionization apparatus 10 with first and second electrodes 1, 2 at a second position, the electrodes being displaceable relative to each other.

FIG. 5 shows schematically an embodiment of an analyzer 100 with an adjustable distance D2 between a first electrode 1 and an outlet A of the ionization apparatus 10.

Figure 5A:
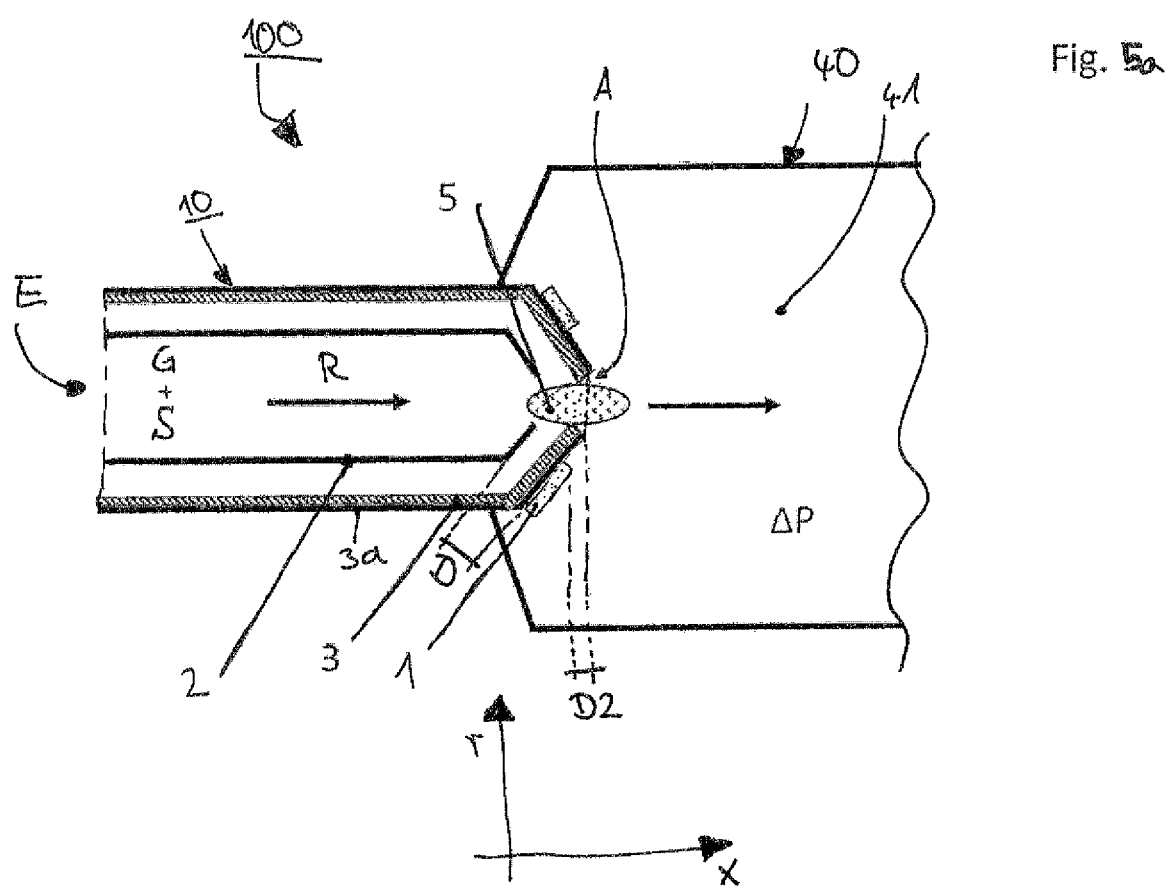

FIG. 5a shows schematically an embodiment of an analyzer 100 with a more detailed representation of the distance D2 between a first electrode 1 and an outlet A of the ionization apparatus 10.

FIG. 6 shows schematically an embodiment of an ionization apparatus 10 with an outwardly curved section 1a of the first electrode 1.

Figure 1:
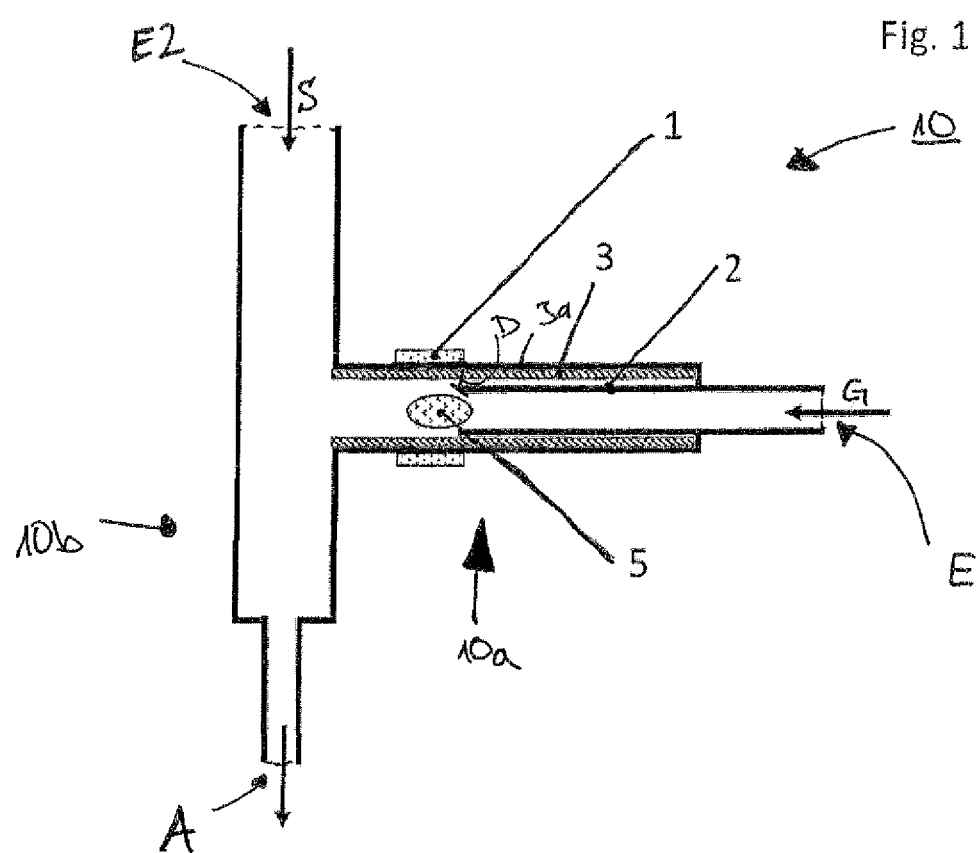

FIG. 1 shows an ionization apparatus 10 comprising a first section 10a and a second section 10b.

The first section 10a comprises an inlet E into which a discharge gas G can or will be introduced. The first section 10a further comprises a first electrode 1, a second electrode 2 and a dielectric element 3. The dielectric element 3 is arranged between the first electrode and the second electrode 2. The first electrode 1 is arranged on an outer surface 3a of the dielectric element 3. A dielectric barrier discharge can be generated between the first electrode 1 and the second electrode 2 by applying an electric voltage, the discharge taking primarily place in a discharge area 5.

When the discharge gas G flows via the inlet E into the first section 10a of the ionization apparatus 10, the discharge gas G will flow through the discharge area 5 and can be ionized in this area.

The first electrode 1 and the second electrode 2 are spaced apart by a distance D. The distance D is shown in FIG. 1 as the shortest distance between the first and second electrodes 1, 2.

The first section 10a is connected to the second section 10b in a manner allowing a flow therethrough or fluid communication, so that the (ionized) discharge gas G can flow from the first section 10a into the second section 10b. The second section 10b comprises an inlet E2 through which a sample or a sample substance or an analyte S can flow into the second section 10b.

In the area of the second section 10b of the ionization apparatus, where the ionized discharge gas G flowing out of the first section 10a and the analyte S are brought into contact, at least a part of the charges of the ionized discharge gas G is transferred to the analyte S, the analyte S being thus ionized.

Via an outlet A in the second section 10b of the ionization apparatus 10, the ionized analyte S and the (ionized) discharge gas G leave the ionization apparatus 10. Subsequently, the ionized analyte S can be analyzed.

In the area of the outlet A in the second section 10b of the ionization apparatus 10, the cross-section is reduced in size so that the cross-sectional area of the outlet is smaller than the cross-sectional area of the inlet E2. The differences in cross-section serve the purpose of pressure control, among other things, since the flow through the ionization apparatus 10 is typically caused by a pressure gradient. The pressure outside the outlet A is here lower than the pressure outside the inlets E, E2 and in the ionizing apparatus 10. This vacuum can be accomplished by a vacuum unit, e.g. a pump, connected to the outlet A (not shown in FIG. 1).

The inlet E2, into which an analyte S can be introduced, is typically open to the surroundings.

Figure 1A:
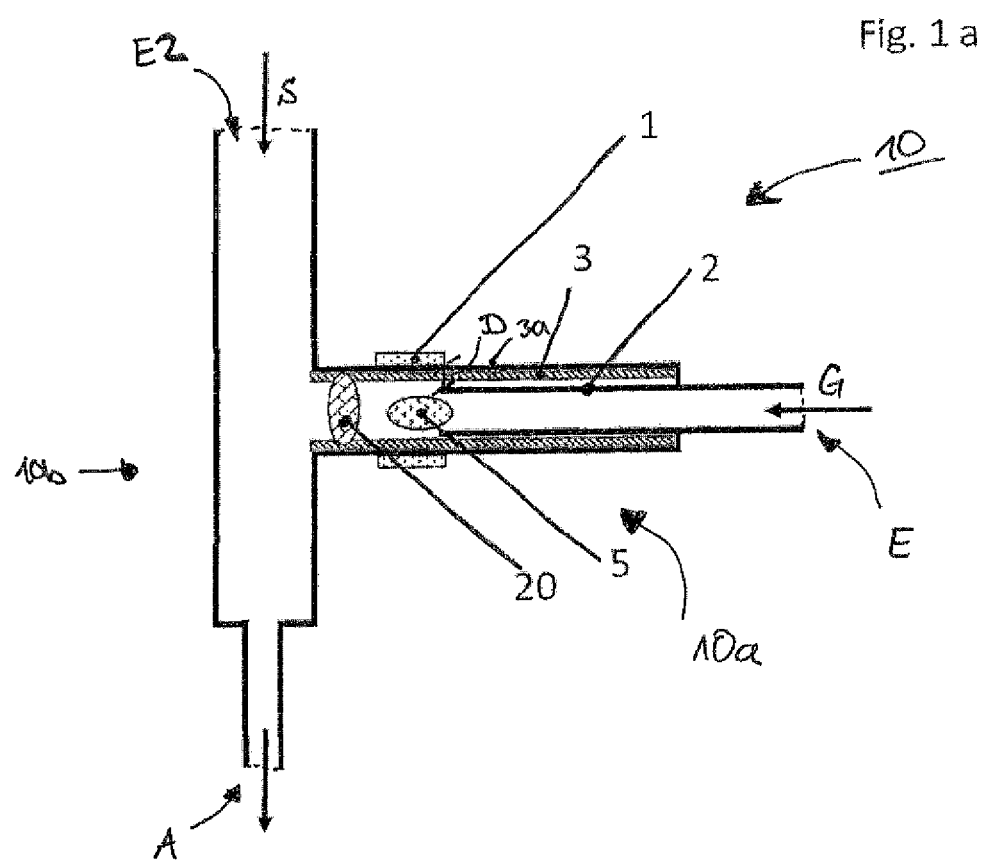

Similar to the embodiment of an ionization apparatus 10 shown in FIG. 1, the ionization apparatus 10 of FIG. 1a comprises a first section 10a and a second section 10b, the sections 10a, 10b being in fluid communication.

In addition to the features and the mode of operation of the ionization apparatus 10 shown in FIG. 1, a grid 20 is arranged in the first section 10a of the ionization apparatus 10 as a charge carrier filter after (downstream of) the discharge area 5. The grid 20 is connected to a voltage source (not shown in FIG. 1a). Depending on the wiring of the grid 20, positively charged particles or negatively charged particles can pass through the grid 20, so that particles with the type of charge (positively or negatively charged) that cannot pass through the grid 20 will be filtered. Examples of charged particles are ions and electrons.

Figure 1B:
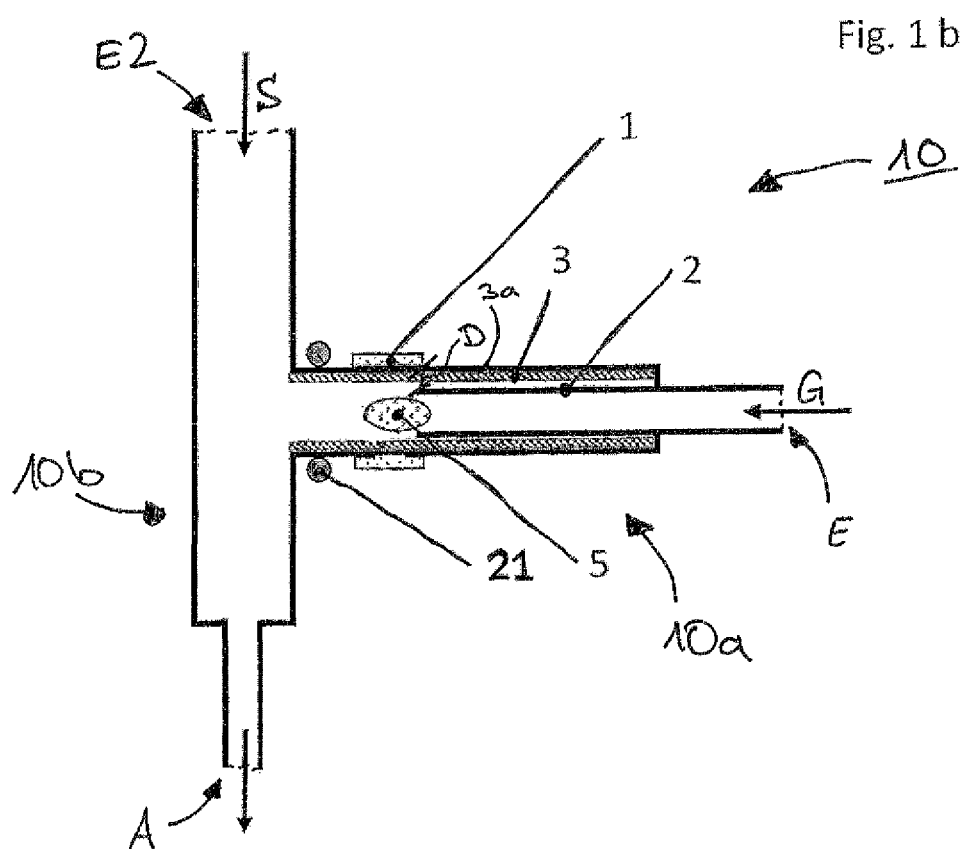

The ionization apparatus 10 shown in FIG. 1b is similar to the ionization apparatus 10 in FIG. 1a, the charge carrier filter provided being a magnet 21 instead of a grid 20 as in FIG. 1a. The magnet 21 is arranged after (downstream of) the discharge area 5 in the first section 10a of the ionization apparatus 10. The magnet 21 generates a magnetic field and allows charged particles of one type of charge (positive or negative) to pass.

Figure 2:
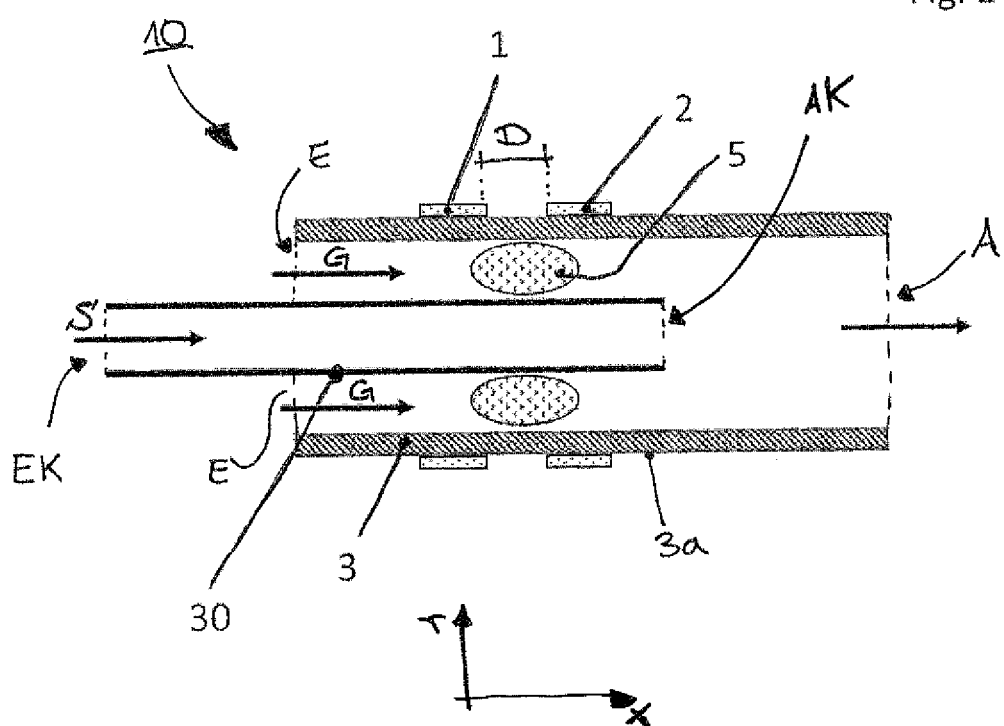

A further embodiment of an ionization apparatus 10 is shown in FIG. 2. The ionization apparatus 10 comprises a dielectric element 3 configured in the form of a hollow cylinder. The dielectric element has an outer surface 3a. The outer surface 3a has arranged thereon a first and a second electrode 1, 2, which are hollow cylindrical in shape. The dielectric element 3 has arranged therein a capillary 30. The capillary 30 is concentric with the dielectric element 3 and is hollow cylindrical in shape. Between the first and second electrodes 1, 2 a dielectric barrier discharge can be caused in a discharge area 5. The discharge area is primarily located in a space between the capillary 30 and the dielectric element 3.

Through the arrangement of the capillary 30 and of the dielectric element 3, an inlet EK into the capillary and an inlet E into the dielectric element 3 are formed. Via the inlet E a discharge gas G can be introduced into the ionization apparatus 10 and via the inlet EK an analyte S can be introduced into the ionization apparatus 10. The discharge gas G can flow through the discharge area 5 and thus be ionized.

The longitudinal dimension of the capillary 30 in a positive x-direction is shorter than the longitudinal dimension of the dielectric element 3 in a positive x-direction, so that after (downstream) the analyte S has flown through an outlet AK of the capillary 30, the flows of the ionized discharge gas G and the analyte S will be united and the ionized discharge gas G will be able to transfer at least part of its charge to the analyte S, so that the analyte S will be ionized. The ionized analyte S can flow out of the ionization apparatus 10 through the outlet A.

The flow in the ionization apparatus 10 may be caused by a vacuum unit at the outlet A (not shown in FIG. 2). The inlet EK to the capillary 30 is preferably open to the surroundings.

The first electrode 1 and the second electrode 2 are spaced apart by a distance D, which, with a constant cross-section of the dielectric element 3, results from the distance in an x-direction.

Figure 3:
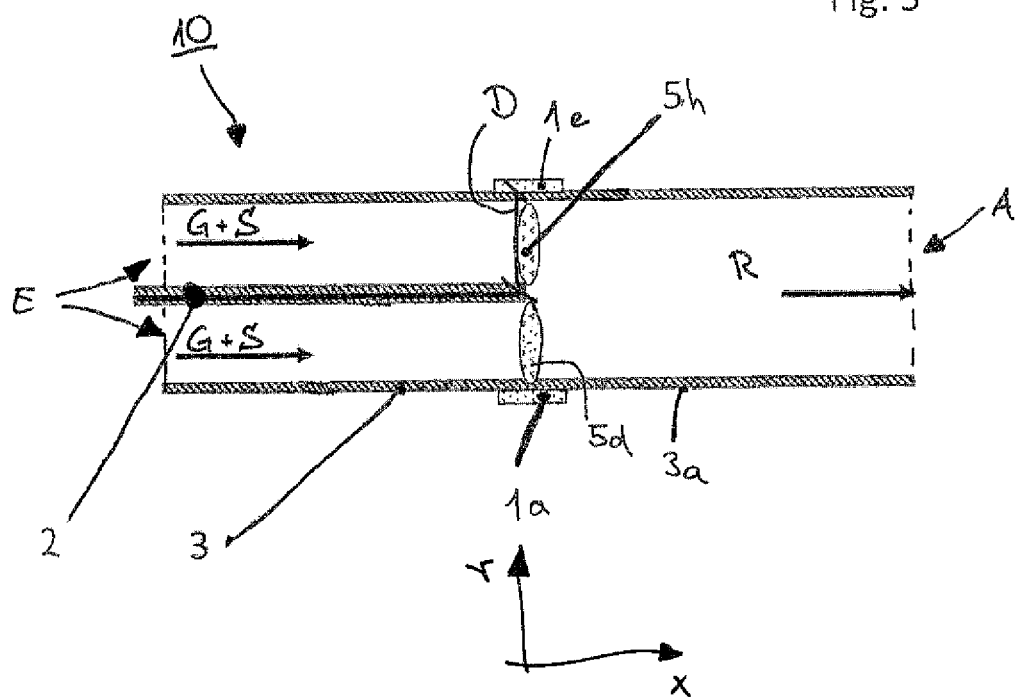
FIG. 3a shows schematically a section through the ionization apparatus 10 of FIG. 3.
FIG. 3b shows schematically an embodiment of an ionization apparatus 10 with a spirally-shaped or helically-shaped first electrode 1.
Figure 3:
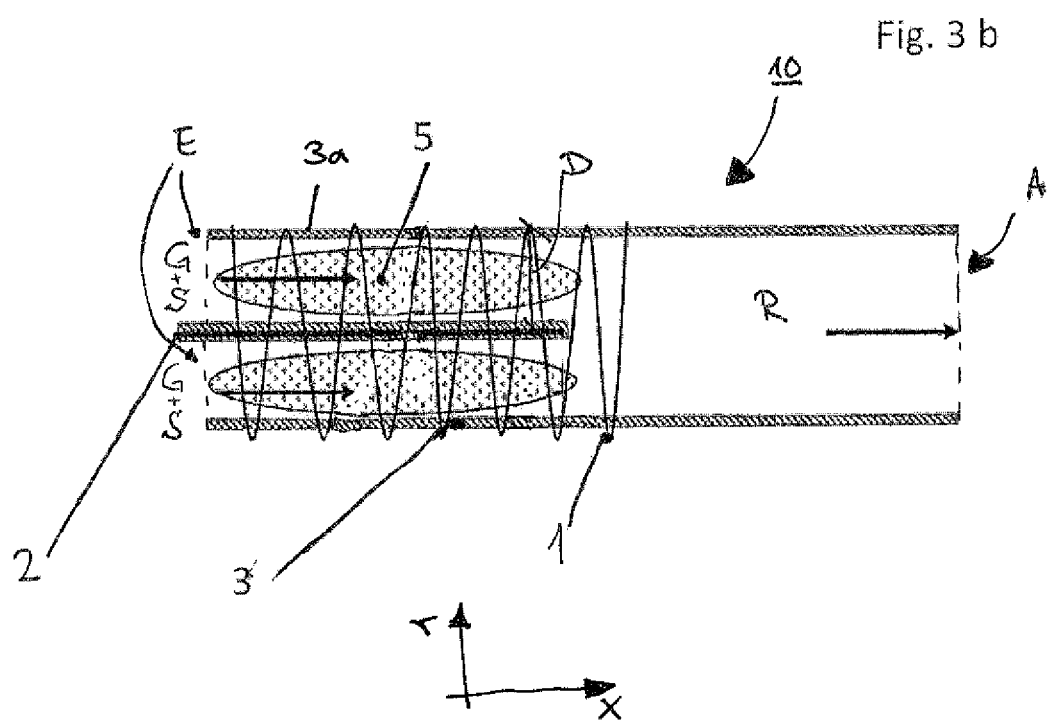

An embodiment of an ionization apparatus 10 comprising a not fully circumferential or a circumferentially interrupted electrode 1 is shown in FIGS. 3 and 3a.

The ionization apparatus 10 comprises a first electrode 1 consisting of a plurality of subelectrodes 1a, 1b, ... 1h, a second electrode 2 and a dielectric element 3 with an outer surface 3a. In the circumferential direction (cf. FIG. 3a), a corresponding number of interruptions 1' is formed between the respective subelectrodes 1a, 1b, ... 1h. The subelectrodes 1a, 1b, ... 1h may be connected in common to a control unit or a control device. A discharge gas G and an analyte S can be introduced into the ionization apparatus via an inlet E and discharged from the ionization apparatus 10 via an outlet A.

The second electrode 2 is here configured in the form of a wire, while in other embodiments the second electrode may also be configured as a hollow body (allowing a flow therethrough), in particular as a hollow cylinder.

Between the second electrode 2 and the subelectrodes 1a, 1b, ... 1h of the first electrode 1, a dielectric barrier discharge is establishable in a plurality of discharge areas 5a, 5b, ... 5h by applying a voltage, the discharge areas 5a, 5b, ... 5h being circumferentially interrupted by the ionization apparatus 10 in a plane perpendicular to a flow direction R. The person skilled in the art will be aware that a clearly defined delimitation of discharge areas in a binary sense will not always be fully possible, but that primary discharge areas, where most of the discharge takes place, can be assigned.

In the embodiment according to FIGS. 3 and 3a, the subelectrodes 1a, 1b, ... 1h are circular in shape, while in other embodiments the subelectrodes may also be configured as rectangles, in particular as squares.

A distance D between the first and second electrodes 1, 2 is given in FIG. 3 in the r-direction.

The embodiment of an ionization apparatus 10 in FIG. 3c is similar to the embodiment according to FIGS. 3 and 3a.

This ionization apparatus 10 comprises a second electrode 2, a dielectric element 3 and a first electrode consisting of a plurality of subelectrodes 1a, 1b, ... 1h, the subelectrodes 1a, 1b, ... 1h being in contact with an outer surface 3a of the dielectric element 3.

A discharge gas G and an analyte S can flow into an inlet E of the ionization apparatus 10 and flow out of the ionization apparatus 10 via an outlet A. The first electrode 1 (subelectrodes 1a, 1b, ... 1h) is a circumferentially interrupted or not fully circumferential electrode, since a plurality of interruptions or spaces 1' is formed between the subelectrodes 1a, 1b, ... 1h. Between the subelectrodes 1a, 1b, ... 1h and the second electrode 2, a dielectric barrier discharge is establishable in a plurality of discharge areas 5a, 5b, ... 5h by applying a voltage. As regards the delimitation of discharge areas, the above statements made in connection with the embodiment according to FIGS. 3 and 3a apply. The subelectrodes 1a, 1b, ... 1h may be connected in common to a control unit or a control device.

The second electrode 2 is configured in the form of a wire and is partly located inside the dielectric element 3.

In this embodiment, the subelectrodes 1a, 1b, ... 1h are rod-shaped, the subelectrodes 1a, 1b, ... 1h having a length (side length of the long sides) that is at least five times greater than their width (end faces).

Due to the rod-shaped design of the subelectrodes 1a, 1b, ... 1h, the discharge areas 5a, 5b, ... 5h can be formed over a greater axial length than in cases where shorter subelectrodes 1a, 1b, ... 1h are used. Preferably, the length of the subelectrodes is at least 5 mm in an axial direction (x-direction). The distance D between the first electrode 1 (subelectrodes 1a, 1b, ... 1h) and the second electrode 2 is constant over the axial length (x-direction) in the overlapping area of the electrodes 1, 2.

In the embodiments according to FIGS. 3, 3a and 3c, the subelectrodes 1a, 1b, ... 1h of the ionization apparatuses 10 are located at identical axial (x-direction) distances from the inlet E and the outlet A, i.e. they are arranged at identical axial positions, while in other embodiments of ionization apparatuses 10, subelectrodes may also be arranged in an axially offset manner (not at identical axial positions).

In a further embodiment of an ionization apparatus 10, shown in FIG. 3b, the ionization apparatus 10 comprises a first electrode 1, a second electrode 2 and a dielectric element 3.

Via an inlet E, a discharge gas G and an analyte S can be introduced into the ionization apparatus 10 and via an outlet A it can be discharged therefrom. The discharge gas G and the analyte S can flow through the ionization apparatus in a flow direction R.

The first electrode 1 is contact with an outer surface 3a of the dielectric element 3 and is spiral or helical in shape. In this embodiment a plurality of windings is shown, while in other embodiments also at least one winding may be arranged. Preferably, at least two windings, in particular at least five windings are provided.

Due to the helical or spiral design of the first electrode 1, the first electrode 1 is not fully circumferential or is circumferentially interrupted in a plane perpendicular to the flow direction R. In this plane a space or an interruption exists circumferentially between respective sections of the first electrode 1. For a better understanding, the first electrode is not shown in a sectional view in FIG. 3b, but, in a sectional view, the first electrode 1 would only be visible in the form of axially offset points outside the dielectric element 3.

Due to the helical or spiral design of the first electrode 1, the first electrode 1 is interrupted parallel to the flow direction R along a distance outside the dielectric element 3, or spaces (depending on the number of windings) are formed.

The second electrode 2 is configured in the form of a wire. The second electrode 2 is partly or sectionwise located inside the dielectric element 3.

Between the first electrode 1 and the second electrode 2 a dielectric barrier discharge is establishable in a discharge area 5 by applying a voltage. Due to the spiral or helical design, the discharge area 5 may be interrupted parallel to the flow direction R along a distance inside the dielectric element 3. Due to the spiral or helical design, the discharge area 5 may be interrupted in a plane perpendicular to the flow direction R, or it may not extend fully over an area in the plane, delimited by the dielectric element 3.

In a further embodiment of an ionization apparatus 10 according to FIGS. 4 and 4a, the ionization apparatus 10 comprises a first electrode 1, a second electrode 2 and a dielectric element 3. A capillary 30, which is arranged sectionwise in the dielectric element 3, is connected to the second electrode 2 and the second electrode 2 is located inside the dielectric element 3.

The capillary 30 comprises an inlet E into which a discharge gas G and an analyte S can be introduced into the ionization apparatus 10. An outlet A of the ionization apparatus 10 can be used for discharging the discharge gas G and the analyte.

The capillary 30 may also be replaced by some other element with dielectric properties.

The second electrode 2 is spiral or helical in shape. Similar to the illustration in FIG. 3b, the second electrode 2 is not shown in a sectional view for better understanding. If FIGS. 4 and 4a were a sectional view, the second electrode 2 would be visible as axially offset points.

A dielectric barrier discharge is establishable between the first electrode 1 and the second electrode 2, when a voltage is applied between the electrodes 1, 2.

The first electrode 1 contacts an outer side 3a of the dielectric element 3 in such a way that the first electrode 1 can be displaced relative to the dielectric element 3. The second electrode 2 cannot be displaced relative to the dielectric element 3, so that the first electrode 1 is displaceable relative to the second electrode 2.

Different positions of the first electrode 1 can be seen from FIGS. 4 and 4a. A look at the position of the first electrode 1 in FIG. 4 shows that the first electrode 1 in FIG. 4a is displaced in a direction opposite to the flow direction R (in a negative x-direction). These different positions of the first electrode 1 lead to overlapping areas of the first and second electrodes 1, 2 that overlap each other to different degrees in the flow direction R (x-direction).

For the position of the first electrode 1 according to FIG. 4, the overlapping area of the first and second electrodes 1, 2 in the flow direction R (x-direction) is larger than for the position of the first electrode 1 according to FIG. 4a.

This results in an adaptability of the volume of the discharge area 5, through which the analyte S to be ionized flows, so that an adaptability of the ionization conditions to the analyte S is given and the sensitivity of a future analysis can be enhanced.

The distance D between the first and second electrodes 1, 2 is identical at both positions (FIGS. 4 and 4a) of the first electrode 1.

FIG. 5 shows schematically an analyzer 100 comprising an ionization apparatus 10 and an analysis unit 40. Any disclosed ionization apparatus 10 can be used in this analyzer, in addition to the ionization apparatus 10 described representatively for this embodiment.

The ionization apparatus 10 comprises a first electrode 1, a second electrode 2 and a dielectric element 3.

The first electrode 1 is arranged outside the dielectric element 3 and the second electrode 2 is located sectionwise inside the dielectric element 3.

The second electrode 2 comprises an inlet E, through which a discharge gas G and an analyte S can be introduced into the ionization apparatus 10.

Between the first and second electrodes 1, 2 a dielectric barrier discharge is establishable in a discharge area 5 by applying a voltage. The first and second electrodes 1, 2 are spaced apart by a distance D. The discharge gas G and the analyte S can flow through the discharge area 5, whereby at least the analyte S is ionized. An outlet of the ionization apparatus 10 has connected thereto an analysis unit 40, e.g. a mass spectrometer or an ion mobility spectrometer. The ionized analyte S is analyzed (qualitatively and/or quantitatively) in the analyzer.

The end of the first electrode 1 (in a positive x-direction) with the discharge area 5, in which or downstream of which the analyte S is ionized, and the analysis unit 40 are spaced apart by a distance D2, preferably parallel to the flow direction R. The distance D2 is adjustable, in particular the positions of the first electrode 1 and of the second electrode 2 relative to each other remaining the same, when the distance D2 is changed.

The adjustability or variability of the distance D2 can be configured in a manner known per se.

Depending on the spatial dimensions of the ionization apparatus 10 and the volume flow flowing through the latter, a time is obtained, in which the ionized analyte S flows with the (ionized) discharge gas G over the distance D2 up to the point of analysis. Within this time, chemical and/or physical processes can take place, which may change the ionization state of the analyte S. For different analytes S, the optimum distance D2 may be different, so that the latter can be adjusted for different analytes S in an advantageous manner.

FIG. 5a shows an analyzer 100 according to a further embodiment. The analyzer 100 comprises an ionization apparatus 10 and an analysis unit 40 with a vacuum chamber 41.

Any disclosed ionization apparatus 10 may be used as an ionization apparatus 10, in addition to the ionization apparatus described representatively for this embodiment.

The ionization apparatus 10 comprises a first electrode 1, a second electrode 2 and a dielectric element 3 with an outer surface 3a. The ionization apparatus 10 comprises an inlet E, through which a discharge gas G and an analyte S can be introduced into the ionization apparatus 10, and an outlet A directly connected to the vacuum chamber 41 of the analysis unit 40.

According to other embodiments, a transition piece or a transition line may be arranged therebetween.

Between the first and second electrodes 1, 2, a dielectric barrier discharge is establishable in a discharge area 5 by applying a voltage between the first and second electrodes 1, 2.

The first electrode 1 and the second electrode 2 are spaced apart by a distance D.

The pressure in the ionization apparatus 10 is higher than the pressure in the vacuum chamber 41, so that a pressure gradient Δp occurs between the ionization apparatus and the vacuum chamber 41. Due to the pressure gradient Δp, the discharge gas G and the analyte S flow into the vacuum chamber 41 of the analysis unit 40, in which the ionized analyte S can be analyzed (qualitatively and/or quantitatively).

The cross-section of the ionization unit 10 (allowing a flow therethrough) tapers towards the outlet A of the ionization apparatus 10 in the flow direction R, so that the inlet E has a larger cross-sectional area than the outlet A. In other embodiments, the reduction in size of the cross-section of the outlet A may also be realized by a restrictor.

The first electrode 1 is arranged in the area of the taper, in particular on the outer surface 3a of the dielectric element 3 in the area of the taper. The first electrode 1 and the outlet A are spaced apart by a distance D2 in the flow direction R or x-direction, while in other embodiments the distance D2 between the second electrode 2 and the outlet A of the ionization apparatus may have to be taken into account, if the second electrode is located closer to the outlet A in the flow direction R or x-direction. The first electrode 1 may also overlap the outlet A in the flow direction R or x-direction, or the second electrode 2 may overlap the outlet A of the ionization apparatus in the flow direction R or x-direction, if the second electrode 2 is located closer to the outlet A of the ionization apparatus than the first electrode 1.

In particular, the distance D2 is less than 50 mm.

This has the effect that, in the case of a dielectric barrier discharge, the discharge area 5 will be located close to the outlet A and partly in the outlet A in the flow direction R or x-direction.

A further embodiment of an ionization apparatus 10 is shown in FIG. 6. The ionization apparatus 10 comprises a first electrode 1, a second electrode 2 and a dielectric element 3 with an outer surface 3a.

Between the first and second electrodes 1, 2 a dielectric barrier discharge is establishable in various discharge areas 5 by applying a voltage.

The first electrode 1 is in contact with the outer surface 3a of the dielectric element 3 and has a section 1a that curves outwards in the r-direction and corresponds to or is identical in shape with a section 3a of the dielectric element that curves outwards in the r-direction.

The dielectric member 3 has an inlet E3 through which a discharge gas G can flow into the ionization apparatus.

The second electrode 2 has an inlet E, through which an analyte S can be introduced into the ionization apparatus 10, and a section thereof is located inside the dielectric element 3. The second electrode 2 has an outwardly curved section 2a or a section of increased thickness partially arranged in the curved section 3a of the dielectric element.

The first electrode 1 and the second electrode 2 are spaced apart by a distance D.

The second electrode 2 is displaceable relative to the first electrode 1 and the dielectric element 3, in particular in the flow direction R or x-direction. A displacement of the second electrode 2 relative to the first electrode 1 results in different positions of the discharge area 5, FIG. 6 showing one of the possible positions.

When a discharge gas G flows into the inlet E3 of the dielectric element 3 and through the discharge area 5, the ionized discharge gas G has to cover a longer distance until the ionized discharge gas comes into contact with the analyte, which has flown into the inlet E of the second electrode 2, and transfers at least part of its charges to the analyte S so as to ionize the analyte. Due to the possibility of changing the length of the distance (corresponding to a change in the length of time under otherwise identical conditions) over which the ionized discharge gas G has to flow until it comes into contact with the analyte S to be ionized, an improved adaptability of the ionization apparatus 10 to different analytes S is obtained, since chemical and/or physical processes will be able to change the ionized discharge gas G as a function of time.

Usual diameters of the discharge paths are between 0.05 mm and 2 mm. The diameter need, however, not be constant over the entire discharge path. The total flow, discharge gas G and analyte S and, optionally, a dopant, into the analysis unit is typically between 0.005 L/min and 5 L/min. The ratio of discharge gas G to analyte S is typically between 0.1:1-100:1.

The diameter of the sample inlet E is typically between 0.2 mm and 3 mm. In general, a dwell time until the analyzer or the vacuum inlet (at an atmospheric pressure of approx. 80 kPa) is reached will be less than 20 ms, if a kinetically controlled ionization is aimed at. For a thermodynamically (kinetically) controlled ionization, the dwell time may be up to 10 s. The dwell time is the time spent by an analyte or a plurality of analytes between the discharge area or the first (in the flow direction, e.g. with ionized discharge gas) coming into contact with a reactive species and the analysis or introduction into a vacuum. The time depends on the geometric design of an ionization apparatus and its arrangement relative to an analysis unit or a vacuum chamber as well as on the volume flows of discharge gas G, analyte or analytes S and, optionally, a dopant.

Various features of the embodiments of the disclosed ionization apparatuses may be combined with other embodiments. In particular, each ionization apparatus may be provided with a charge carrier filter of the type disclosed here, the first and the second electrode may be arranged on the outer surface of the dielectric element in each ionization apparatus, the first and/or the second electrode may be not fully circumferential or circumferentially interrupted in each ionization apparatus, the first and/or the second electrode may be sectionwise spiral in shape or helical in shape in each ionization apparatus, the first and/or the second electrode may be arranged such that they are displaceable relative to each other in each ionization apparatus, the first and/or the second electrode may curve outwards in each ionization apparatus and/or the first and/or the second electrode and/or the dielectric element may curve outwards in each ionization apparatus.

An analyzer can be formed with each ionization apparatus by connecting, optionally directly, the respective ionization apparatus with an analysis unit. Each analyzer may exhibit a distance of less than 50 mm between the first electrode and the outlet of the ionization apparatus and/or may be configured such that and connected to an analysis unit such that an analyte or a plurality of analytes will be able to flow, in less than 1 s, over a distance between a discharge area or a first coming into contact of a reactive species with an analyte or a plurality of analytes and an analysis unit or a vacuum chamber.

The respective ionization may be effected as flow-through ionization.

The invention claimed is:

1. An ionization apparatus for ionizing an analyte, comprising:
    an inlet;
    an outlet;
    a first electrode;
    a second electrode; and
    a dielectric element;
    wherein the first electrode, the second electrode, and the dielectric element are arranged relative to one another such that, by applying an electric voltage between the first electrode and the second electrode, a dielectric barrier discharge is establishable in a discharge area in the ionization apparatus; and
    wherein the first and second electrodes are arranged such that they are displaceable or movable relative to each other,
    wherein the first and second electrodes are displaceable relative to each other in a flow direction of the analyte through the ionization apparatus or in a direction opposite to the flow direction.

2. The ionization apparatus according to claim 1, wherein the first or second electrode is spiral or helical in shape sectionwise.

3. The ionization apparatus according to claim 1, wherein the second electrode is arranged in the dielectric element sectionwise.

4. The ionization apparatus according to claim 1, wherein the first electrode or the second electrode comprises at least one winding.

5. The ionization apparatus according to claim 1, wherein the smallest distance between the first electrode and the second electrode during an ionization is less than 20 mm.

6. The ionization apparatus according to claim 1, wherein the first electrode is arranged to be displaceable relative to the dielectric element.

7. The ionization apparatus according to claim 1, wherein the second electrode is arranged to be non-displaceable relative to the dielectric element.

8. The ionization apparatus according to claim 1, wherein the pressure in the ionization apparatus is higher than 40 kPa.

9. The ionization apparatus according to claim 1, wherein the first electrode is arranged outside the dielectric element.

10. A method of operating an ionization apparatus comprising an inlet, an outlet, a first electrode, a second electrode, and a dielectric element, wherein:
    the first electrode, the second electrode, and the dielectric element are arranged relative to one another such that, by applying an electric voltage between the first electrode and the second electrode, a dielectric barrier discharge is establishable in a discharge area in the ionization apparatus; and
    the first and second electrodes are displaceable relative to each other, and the first and second electrodes are displaced in a flow direction of the analyte through the ionization apparatus or in a direction opposite to the flow direction;
    wherein the method comprises:
        introducing an analyte into the ionization apparatus;
        ionizing the analyte in the ionization apparatus by means of a dielectric barrier discharge in the discharge area; and
        discharging the ionized analyte from the ionization apparatus via the outlet.

11. The method according to claim 10, wherein the pressure in the ionization apparatus is higher than 40 kPa.

12. The method according to claim 10, wherein a voltage of not more than 20 kV applied between the first electrode and the second electrode, so as to generate a dielectric barrier discharge.

13. The method according to claim 10, wherein the dielectric barrier discharge is caused by unipolar high-voltage pulses with a pulse duration of not more than 1 µs.

14. The method according to claim 13, wherein the high-voltage pulses have a frequency of not more than 100 GHz.

15. The method according to claim 10, wherein the first and second electrodes are supplied with a sinusoidal voltage.

16. The method according to claim 15, wherein the sinusoidal voltage of one electrode being shifted by half a period duration with respect to the other electrode.

17. A method of operating an ionization apparatus comprising an inlet, an outlet, a first electrode, a second electrode, and a dielectric element, wherein:
    the first electrode, the second electrode, and the dielectric element are arranged relative to one another such that, by applying an electric voltage between the first electrode and the second electrode, a dielectric barrier discharge is establishable in a discharge area in the ionization apparatus, wherein the dielectric barrier discharge is caused by unipolar high-voltage pulses with a pulse duration of not more than 1 µs; and
    the first and second electrodes are displaceable relative to each other;
    wherein the method comprises:
        introducing an analyte into the ionization apparatus;
        ionizing the analyte in the ionization apparatus by means of a dielectric barrier discharge in the discharge area; and
        discharging the ionized analyte from the ionization apparatus via the outlet.

18. The method according to claim 17, wherein the high-voltage pulses have a frequency of not more than 100 GHz.

19. A method of operating an ionization apparatus comprising an inlet, an outlet, a first electrode, a second electrode, and a dielectric element, wherein:
    the first electrode, the second electrode, and the dielectric element are arranged relative to one another such that, by applying an electric voltage between the first electrode and the second electrode, a dielectric barrier discharge is establishable in a discharge area in the ionization apparatus, wherein the first and second electrodes are supplied with a sinusoidal voltage, the sinusoidal voltage of one electrode being shifted by half a period duration with respect to the other electrode; and
    the first and second electrodes are displaceable relative to each other;
    wherein the method comprises:
        introducing an analyte into the ionization apparatus;
        ionizing the analyte in the ionization apparatus by means of a dielectric barrier discharge in the discharge area; and discharging the ionized analyte from the ionization apparatus via the outlet.

20. The method according to claim 19, wherein the dielectric barrier discharge is caused by unipolar high-voltage pulses with a pulse duration of not more than 1 µs.

* * * * *